(12) United States Patent
Divan et al.

(10) Patent No.: US 8,179,702 B2
(45) Date of Patent: May 15, 2012

(54) VOLTAGE SYNTHESIS USING VIRTUAL QUADRATURE SOURCES

(75) Inventors: Deepakraj M. Divan, Marietta, GA (US); Jyoti Sastry, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 546 days.

(21) Appl. No.: 12/299,730

(22) PCT Filed: May 3, 2007

(86) PCT No.: PCT/US2007/010674
§ 371 (c)(1),
(2), (4) Date: Jun. 1, 2009

(87) PCT Pub. No.: WO2007/130481
PCT Pub. Date: Nov. 15, 2007

(65) Prior Publication Data
US 2010/0019805 A1    Jan. 28, 2010

Related U.S. Application Data

(60) Provisional application No. 60/798,102, filed on May 5, 2006.

(51) Int. Cl.
*H02M 1/12*    (2006.01)
(52) U.S. Cl. ......................................................... 363/40
(58) Field of Classification Search ................... 363/39, 363/40, 41, 65; 327/113, 119, 551; 307/105
See application file for complete search history.

(56) References Cited

U.S. PATENT DOCUMENTS

| | | | | |
|---|---|---|---|---|
| 2,450,005 A | * | 9/1948 | Emile Labin et al. | 342/398 |
| 2,568,375 A | * | 9/1951 | Toulon | 307/106 |
| 4,320,531 A | * | 3/1982 | Dimon | 455/203 |

(Continued)

FOREIGN PATENT DOCUMENTS
WO    WO 2007130481 A2 *  11/2007

OTHER PUBLICATIONS

Hersheyenergy.com. May 5, 2005. [online], [retrieved on Oct. 11, 2007] [Retrieved from the internet] <http://web.archive.org/web/20050505-re_/http://www.hersheyenergy.com/harmonics.html>.

(Continued)

*Primary Examiner* — Adolf Berhane
(74) *Attorney, Agent, or Firm* — Merchant & Gould

(57) ABSTRACT

Voltage synthesis using virtual quadrature sources may be provided. First, a quadrature wave form may be created. The quadrature wave form may have the same frequency as an input voltage and may be ninety degrees out of phase with the input voltage. Next, a harmonic wave form may be created. The harmonic wave form may be based upon an even harmonic of the input voltage and may comprise a triplen wave form. Then, the quadrature wave form and the harmonic wave form may be added to create a resultant wave form. The resultant wave form may be contained within an envelope defined by the input voltage. Next, duty cycle control may be applied to the resultant wave form to create an output voltage. The duty cycle control may be applied without using an energy storage device.

21 Claims, 31 Drawing Sheets

U.S. PATENT DOCUMENTS

| | | | |
|---|---|---|---|
| 4,719,551 A * | 1/1988 | Nishizawa et al. | 363/41 |
| 5,262,730 A * | 11/1993 | Smith et al. | 324/650 |
| 5,619,581 A | 4/1997 | Ferguson et al. | |
| 6,693,409 B2 | 2/2004 | Lynch et al. | |
| 7,778,053 B2 * | 8/2010 | Gritter | 363/42 |
| 7,787,575 B2 * | 8/2010 | Dawson et al. | 375/354 |

OTHER PUBLICATIONS

Dictionary.com. Definition of "quadrature." May 5, 2005. [online], [retrieved on Oct. 10, 2007], [Retreived from the—internet] <http://web.archive.org/web/20071009193600/http://dictionary.reference.com/search?q=quadrature&x=0&y=0>.

* cited by examiner

VOLTAGE SYNTHESIS USING VIRTUAL QUADRATURE SOURCES

This application is a National Stage Application of PCT/US2007/010674, filed 5 Nov. 2008, which claims benefit of Ser. No. 60/798,102, filed 5 May 2006 in the United States and which applications are incorporated herein by reference. To the extent appropriate, a claim of priority is made to each of the above disclosed applications. This application is being filed in the name of GEORGIA TECH RESEARCH CORPORATION, a U.S. national corporation, applicant for the designation of all countries except the US; Deepakraj M. Divan, a citizen of the United States of America, applicant for the designation of the US only; and Jyoti SASTRY, a citizens of India, applicant for the designation of the US only.

BACKGROUND

Power converters are used to synthesize a desired voltage from an available voltage using pulse width modulation techniques. In the most general case, the synthesized voltage has a different frequency and amplitude in relation to the incoming voltage (e.g. variable speed motor drives.) In such applications, the power converter of choice is either an alternating current (AC)-direct current (DC)-AC rectifier-inverter system or an AC-AC matrix converter system. The common characteristic of all these systems is the need for an energy storage element or source (equivalent in electrical terms) that provides an outer boundary/envelope within which a desired voltage synthesis is done.

The simplest form of such a converter is a buck converter, where a desired output voltage $V_o$ is synthesized from a source voltage $V_s$, using fixed frequency pulse wave modulation (PWM) techniques, with the relation, $V_o = D \times V_s$, where D is the duty cycle of operation for the switch. $V_o$ falls within the envelope defined by Vs and zero volts. FIG. 1A shows a conventional inverter. With FIG. 1A's inverter, the 'envelope' is defined by the two DC supply voltages. The desired output voltage falls within this envelope if it is to be successfully synthesized. This technique forms the basis for control for all DC/DC converters, inverters, and voltage source converters. FIG. 1B shows a region of achievable output voltage corresponding to the conventional inverter shown in FIG. 1A.

In the case where multi-phase AC sources are available, a desired output voltage (DC or AC) could be synthesized directly from the multiple AC sources using a conventional 'matrix converter'. FIG. 2A shows a schematic of a single output line of a conventional matrix converter. FIG. 2B shows an 'envelope' within which a desired output voltage is to be synthesized using the conventional matrix converter of FIG. 2A. Both, inverters and matrix converters, are able to synthesize any frequency on the output. While it may appear that matrix converters do not require bulk energy storage in DC capacitors, they do equivalently need additional sources, as well as switches to interconnect each available phase to the desired output terminal.

Power system networks are currently faced with the problem of the inability to control voltages and currents in the network. In any meshed power network, control of the voltage magnitude and phase angle is of vital importance owing to the constant increase in the load on the network as well as the erratic nature of load profiles. Conventional methods of control include shunt VAR compensators, shunt and series FACTS devices and phase angle regulators. FACTS devices are faced with the problem of high cost and have thereby not significantly penetrated the area of power flow control. Phase angle regulators are in use extensively however, they provide slow response and only phase angle control. The need for a device that provides phase angle control and well as voltage amplitude control simultaneously is highlighted by the inadequacies of current technologies.

Furthermore, power networks require voltage amplitude control within a certain range, roughly at ±10% of the nominal voltage. Therefore, a solution to the problem of control of voltages and currents is required that provides an adequate level of control on the system while having a minimal topology with minimum cost.

SUMMARY

Consistent with embodiments of the present invention, systems and methods are disclosed for voltage synthesis using virtual quadrature sources. First, a quadrature wave form may be created. Next, a harmonic wave form may be created. Then, the quadrature wave form and the harmonic wave form may be added to create a resultant wave form. Next, duty cycle control may be applied to the resultant wave form to create an output voltage. The duty cycle control may be applied without using an energy storage device.

It is to be understood that both the foregoing general description and the following detailed description are examples and explanatory only, and should not be considered to restrict the invention's scope, as described and claimed. Further, features and/or variations may be provided in addition to those set forth herein. For example, embodiments of the invention may be directed to various feature combinations and sub-combinations described in the detailed description.

BRIEF DESCRIPTION OF THE DRAWINGS

The accompanying drawings, which are incorporated in and constitute a part of this disclosure, illustrate various embodiments of the present invention. In the drawings.

DETAILED DESCRIPTION

Figure 1A:
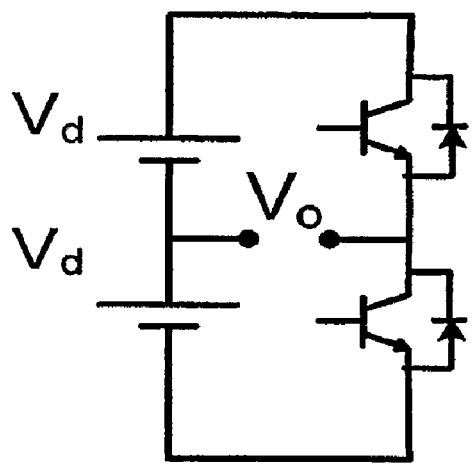
FIG. 1A shows a conventional inverter.
Figure 1B:
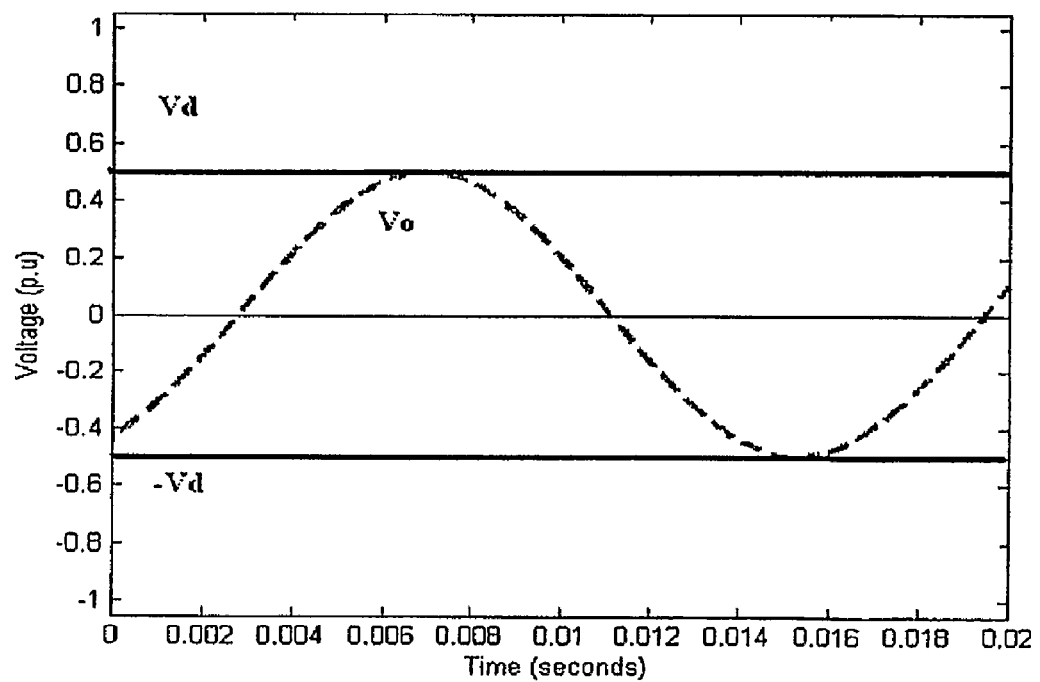
FIG. 1B shows a region of achievable output voltage corresponding to the conventional inverter shown in FIG. 1A.
Figure 2A:
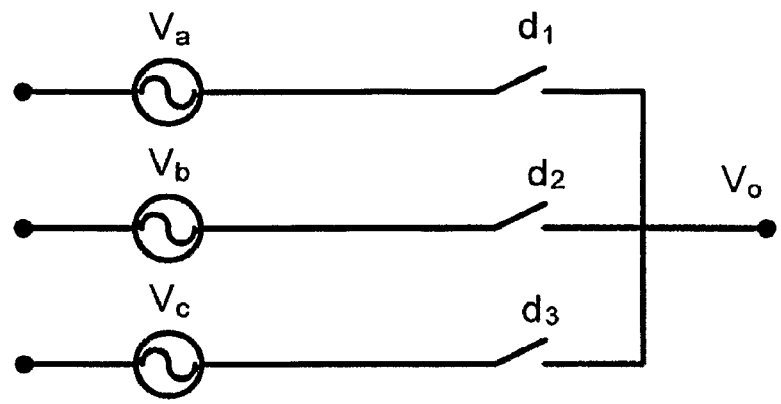
FIG. 2A shows a schematic of a single output line of a conventional matrix converter.
Figure 2B:
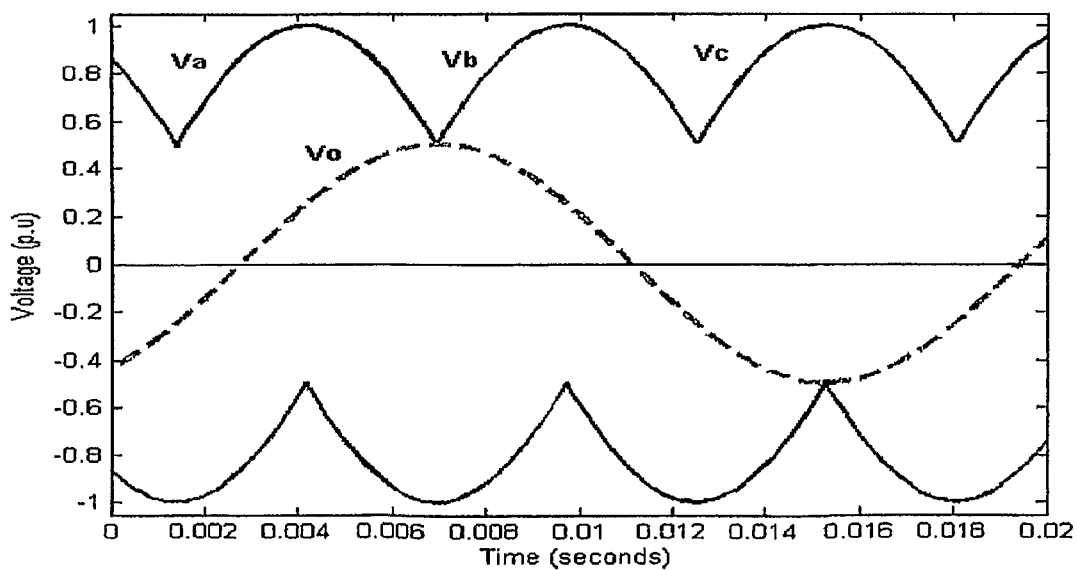
FIG. 2B shows an 'envelope' within which a desired output voltage is to be synthesized using the conventional matrix converter of FIG. 2A.

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

In applications, the available voltage may be an AC line voltage that has to be conditioned. Such conditioning may involve a change in the amplitude, phase angle, or harmonics associated with the incoming voltage, but does not require a change in the line frequency. Applications include voltage regulation, power factor, harmonic control, or injection of missing voltage. In many of these applications, the phase angle or harmonic content of the available AC line voltage has to be changed. This may require addition of finite voltage to the line voltage when the line voltage is undergoing a zero crossing to provide the energy required to generate the desired voltage on the output. The conventional way to achieve this is through the use of inverters or matrix converters, both of which involve stored energy or multiple sources. DVRs, active filters and FACTS devices are examples of inverter based AC line conditioners.

Figure 3A:
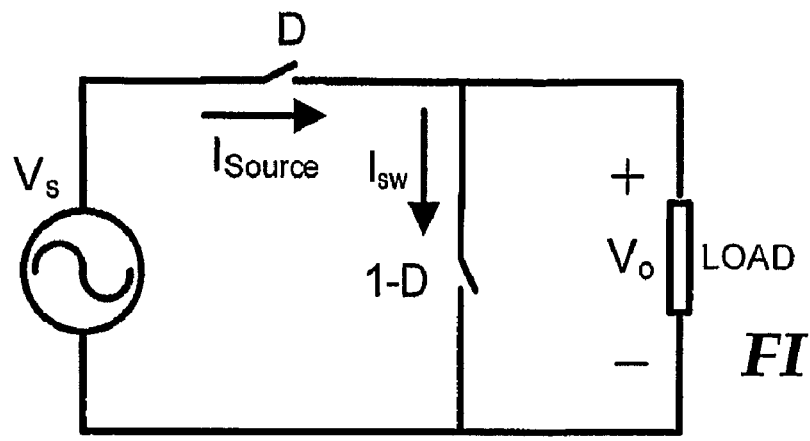
FIG. 3A shows an AC chopper.
Figure 3B:
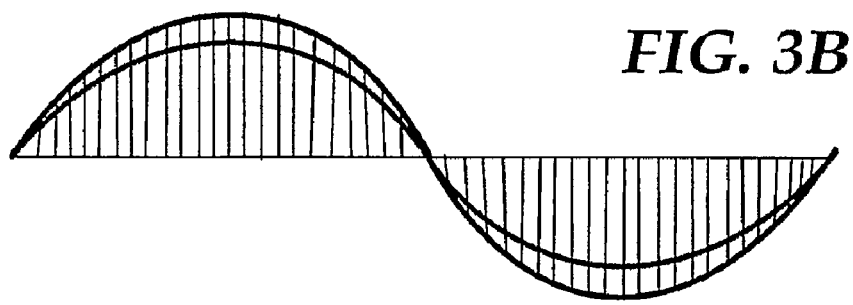
FIG. 3B shows an envelope within which the AC chopper of FIG. 3A may produce a wave form.
Figure 3C:
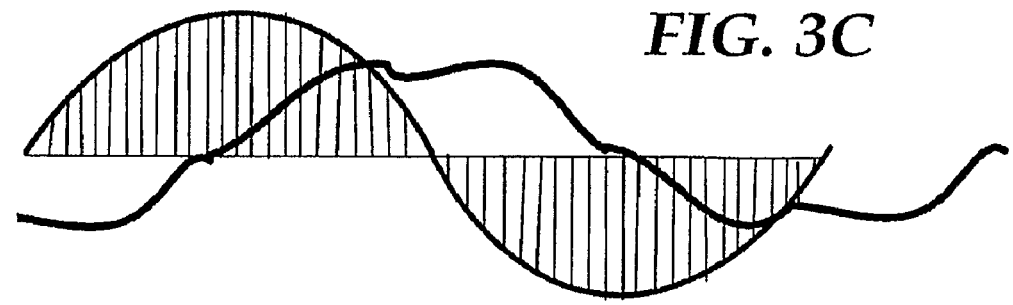
FIG. 3C shows an envelope within which the AC chopper of FIG. 3A may not produce a wave form when the AC chopper of FIG. 3A is operating in a conventional manner.

FIG. 3A shows an AC chopper, which is one type of AC line conditioner. It has a low component count and no stored energy, but when used in conventional processes, is limited in the output voltage that it can realize. The converter is typically operated with a fixed duty cycle 'D' to realize a scaled version of the incoming line voltage. For example, the AC chopper shown in FIG. 3A may produce the wave form shown within the envelope shown in FIG. 3B, but may not produce the wave form shown outside the envelope shown in FIG. 3C when used in conventional processes. In other words, with conventional processes, it is not possible to use the AC chopper shown in FIG. 3A to obtain phase shifted or harmonic modified voltages that require finite output voltage at the zero crossing points of the incoming line voltage because of the perceived inability to synthesize such voltage. Consistent with embodiments of the invention, dual virtual quadrature sources may be provided that allow the synthesis of output voltages with controllable phase and/or harmonic levels without requiring the use of stored energy or additional sources and switches.

Figure 4:
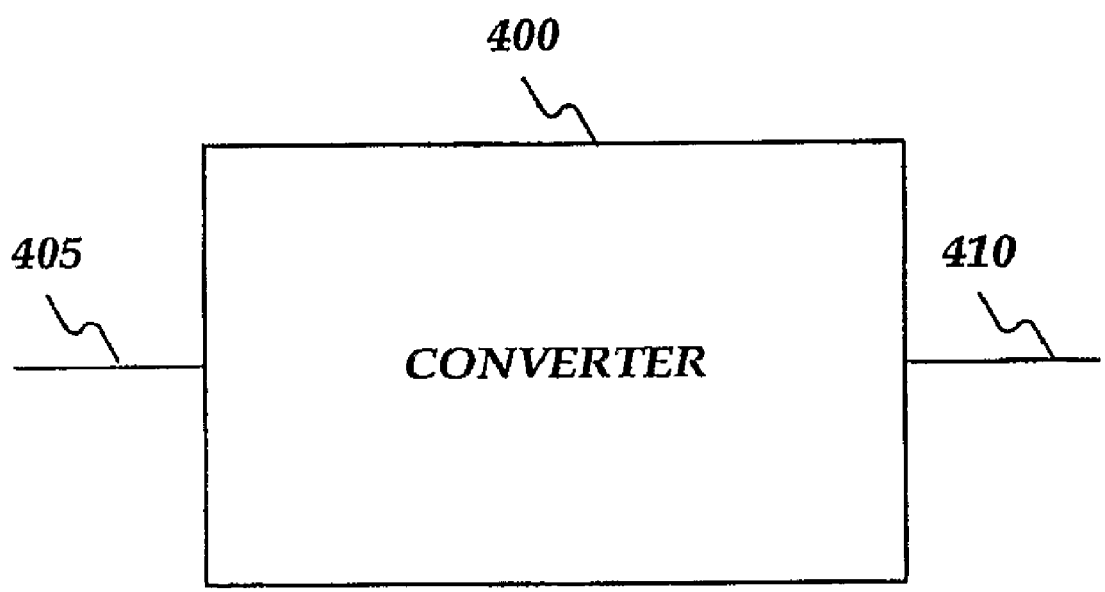
FIG. 4 shows a converter.

An embodiment consistent with the invention may comprise a system for providing an output voltage. The system may comprise a converter 400 as shown in FIG. 4. An input power line 405 may provide an input voltage to converter 400 and output power line 410 may provide an output voltage from converter 400. Both the input voltage and the output voltage may be AC and may be three phase. Converter 400 may comprise a component configured to receive an input voltage, a component configured to create a quadrature wave form, and a component configured to create a harmonic wave form. In addition, converter 400 may comprise a component configured to add the quadrature wave form and the harmonic wave form to create a resultant wave form that is contained within an envelope defined by the input voltage. And converter 400 may comprise a component configured to apply duty cycle control to the resultant wave form to create the output voltage. Converter 400 may perform processes for providing an output voltage, including, for example, one or more of the stages of method 600 described below with respect to FIG. 6.

Converter 400 may be practiced in an electrical circuit comprising discrete electronic elements, packaged or integrated electronic chips containing logic gates, a circuit utilizing a microprocessor, or on a single chip containing electronic elements or microprocessors. Converter 400 may also be practiced using other technologies capable of performing logical operations such as, for example, AND, OR, and NOT, including but not limited to mechanical, optical, fluidic, and quantum technologies. In addition, embodiments of the invention may be practiced within a general purpose computer or in any other circuits or systems.

An embodiment consistent with the invention may comprise a system for providing an output voltage. The system may comprise a memory storage for maintaining a database and a processing unit coupled to the memory storage. The processing unit may be operative to create a quadrature wave form and to create a harmonic wave form. The processing unit may be further operative to add the quadrature wave form and the harmonic wave form to create a resultant wave form and to apply duty cycle control to the resultant wave form to create the output voltage. Any suitable combination of hardware, software, and/or firmware may be used to implement the memory, processing unit, or other components. By way of example, the memory, processing unit, or other components may be implemented with a processor 500 as described below with respect to FIG. 5 below. The aforementioned system and processors are exemplary and other systems and processors may comprise the aforementioned memory, processing unit, or other components, consistent with embodiments of the present invention.

Figure 5:
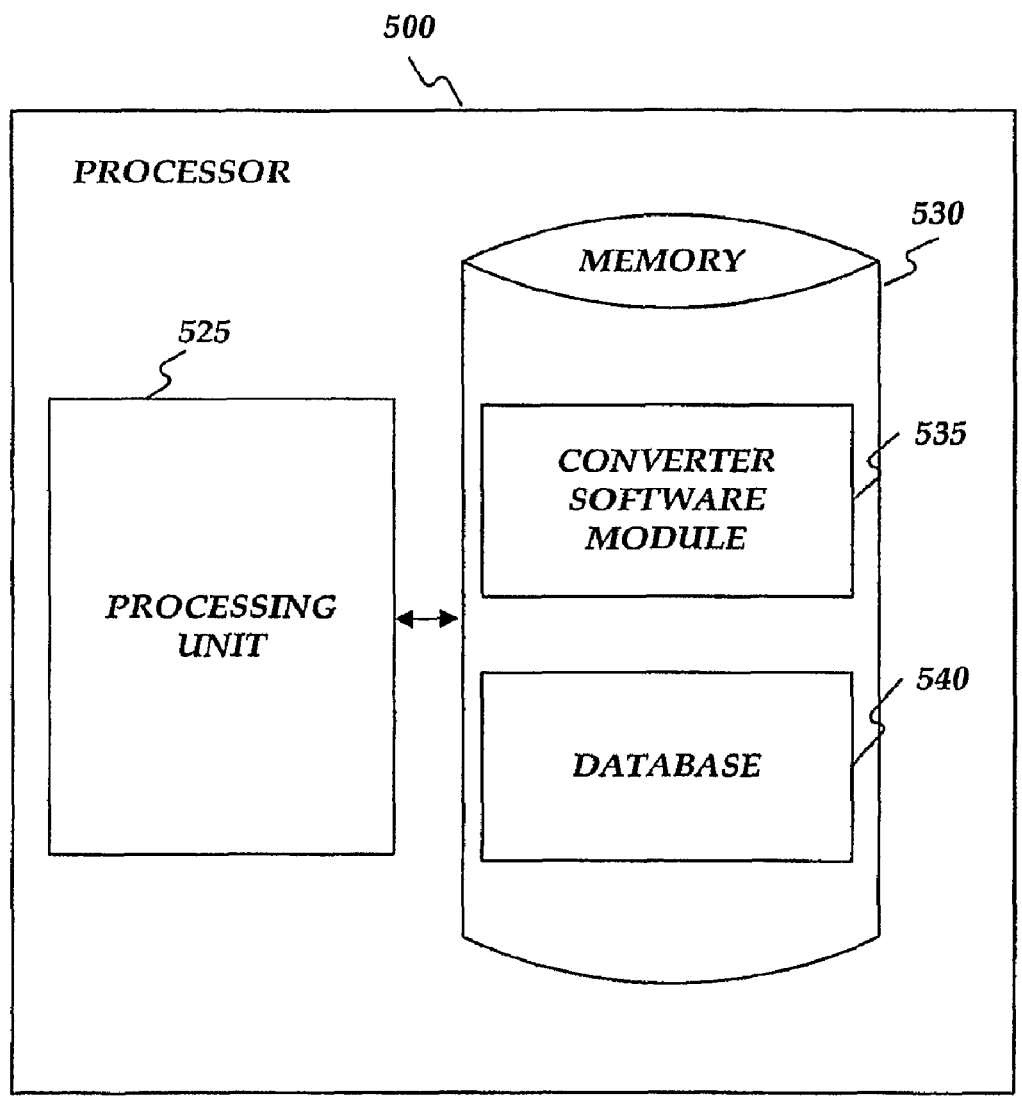
FIG. 5 shows a processor.

FIG. 5 shows processor 500 in more detail. As shown in FIG. 5, processor 500 may include a processing unit 525 and a memory 530. Memory 530 may include a converter software module 535 and a database 540. While executing on processing unit 525, converter software module 535 may perform processes for voltage synthesis, including, for example, one or more of the stages of method 600 described below with respect to FIG. 6. In order to carry out one or more of the stages of method 600, processor 500 may interface with other components to connect to input and output power lines.

Processor 500 ("the processor") may be implemented using a personal computer, network computer, mainframe, or other similar microcomputer-based workstation. The processor may though comprise any type of computer operating environment, such as hand-held devices, multiprocessor systems, microprocessor-based or programmable sender electronic devices, minicomputers, mainframe computers, and the like. The processor may also be practiced in distributed computing environments where tasks are performed by remote processing devices. Furthermore, the processor may comprise a mobile terminal, such as a smart phone, a cellular telephone, a cellular telephone utilizing wireless application protocol (WAP), personal digital assistant (PDA), intelligent pager, portable computer, a hand held computer, a conventional telephone, or a facsimile machine. The aforementioned systems and devices are exemplary and the processor may comprise other systems or devices.

Processor 500 may reside on a network. The network may comprise, for example, a local area network (LAN) or a wide area network (WAN). Such networking environments are commonplace in offices, enterprise-wide computer networks, intranets, and the Internet. When a LAN is used as the network, a network interface located at any of the processors may be used to interconnect any of the processors. When the network is implemented in a WAN networking environment, such as the Internet, the processors may typically include an internal or external modem (not shown) or other means for establishing communications over the WAN. Further, in utilizing the network, data sent over the network may be encrypted to insure data security by using known encryption/decryption techniques.

In addition to utilizing a wire line communications system as the network, a wireless communications system, or a combination of wire line and wireless may be utilized as the network in order to, for example, exchange web pages via the Internet, exchange e-mails via the Internet, or for utilizing other communications channels. Wireless can be defined as radio transmission via the airwaves. However, it may be appreciated that various other communication techniques can be used to provide wireless transmission, including infrared line of sight, cellular, microwave, satellite, packet radio, and spread spectrum radio. The processors in the wireless environment can be any mobile terminal, such as the mobile terminals described above. Wireless data may include, but is not limited to, paging, text messaging, e-mail, Internet access and other specialized data applications specifically excluding or including voice transmission. For example, the processors may communicate across a wireless interface such as, for example, a cellular interface (e.g., general packet radio system (GPRS), enhanced data rates for global evolution (EDGE), global system for mobile communications (GSM)), a wireless local area network interface (e.g., WLAN, IEEE 802.11), a bluetooth interface, another RF communication interface, and/or an optical interface.

Processor 500 may also transmit data by methods and processes other than, or in combination with, the network. These methods and processes may include, but are not limited to, transferring data via, diskette, flash memory sticks, CD ROM, facsimile, conventional mail, an interactive voice response system (IVR), or via voice over a publicly switched telephone network.

Figure 6:
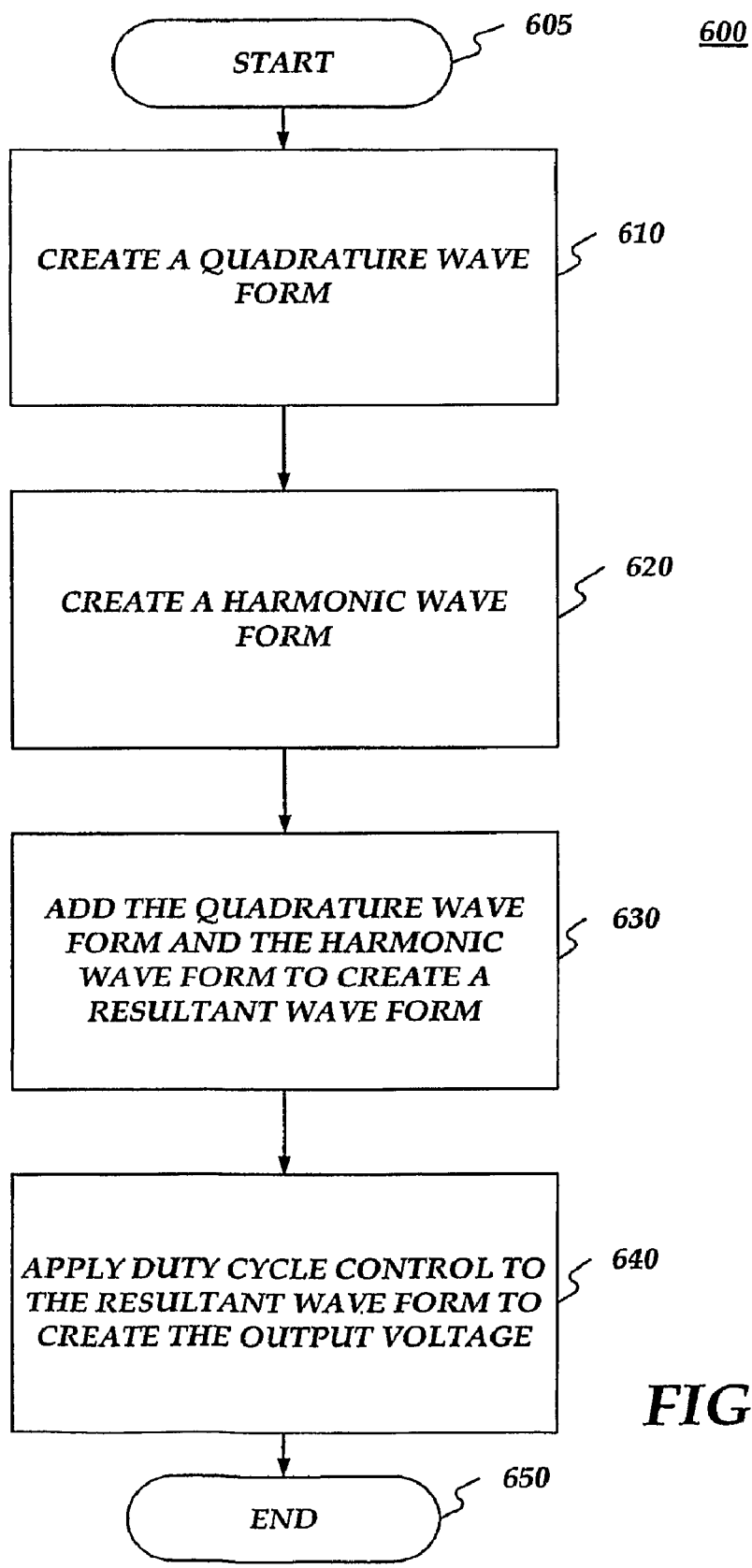
FIG. 6 is a flow chart of a method for providing an output voltage.

FIG. 6 is a flow chart setting forth the general stages involved in a method 600 consistent with an embodiment of the invention for providing an output voltage. Method 600 may be implemented, for example, using converter 400 as described in detail above with respect to FIG. 4 or using processor 500 as described in detail above with respect to FIG. 5. Ways to implement the stages of method 600 will be described in greater detail below. The aforementioned are examples and other converters, processors, and devices may be used. Moreover, further detail regarding the stages of method 600 may be described below.

Method 600 may begin at starting block 605 and proceed to stage 610 where converter 400 may create a quadrature wave form. For example, the quadrature wave form may have the same frequency as an input voltage and may be ninety degrees out of phase with an input voltage. The quadrature wave form may be described in more detail below at least in FIGS. 7A through 7C.

From stage 610, where converter 400 creates the quadrature wave form, method 600 may advance to stage 620 where converter 400 may create a harmonic wave form. For example, the harmonic wave form may be based upon an even harmonic of the input voltage and may comprise a triplen wave form. The harmonic wave form may be described in more detail below at least in FIGS. 7A through 7C.

Once converter 400 creates the harmonic wave form in stage 620, method 600 may continue to stage 630 where converter 400 may add the quadrature wave form and the harmonic wave form to create a resultant wave form. For example, the resultant wave form may be contained within an envelope defined by the input voltage as described below in more detail below at least with respect to FIG. 7C.

After converter 400 adds the quadrature wave form and the harmonic wave form to create the resultant wave form in stage 630, method 600 may proceed to stage 640 where converter 400 may apply duty cycle control to the resultant wave form to create the output voltage. For example, the duty cycle control may be supplied without using an energy storage device. Moreover, the duty cycle control may be applied by the AC chopper shown in FIG. 3A, for example. Once converter 400 applies duty cycle control to the resultant waveform to create the output voltage in stage 640, method 600 may then end at stage 650.

Figure 7A:
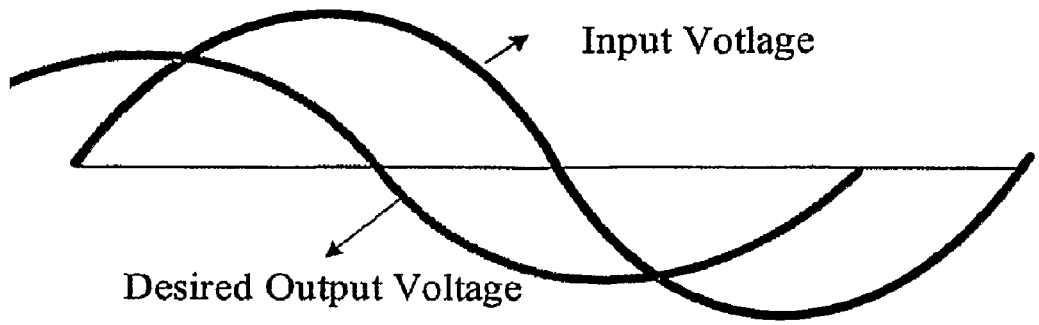
FIG. 7A shows an input and output voltage.
Figure 7B:
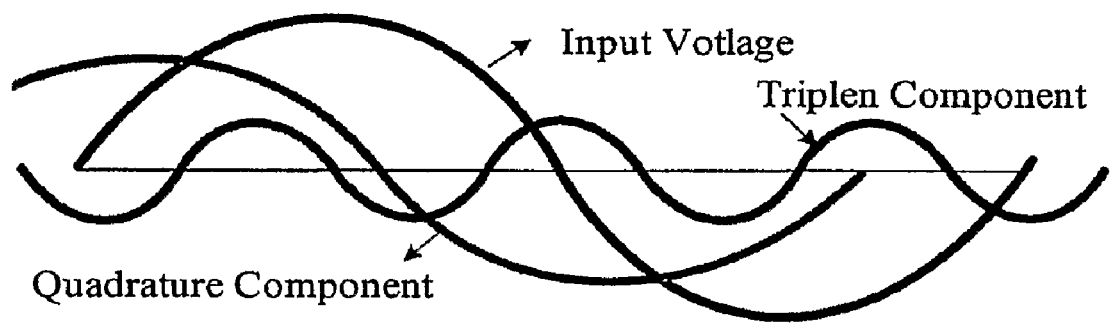
FIG. 7B shows the addition of triplen and quadrature components.
Figure 7C:
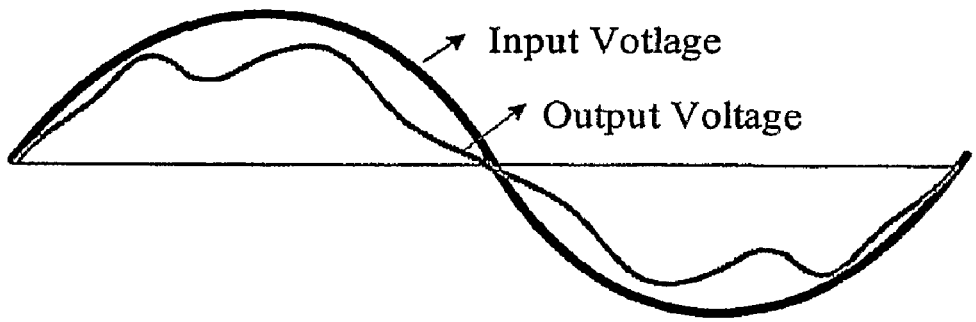
FIG. 7C shows a resultant voltage $V_o$.
Figure 8A:
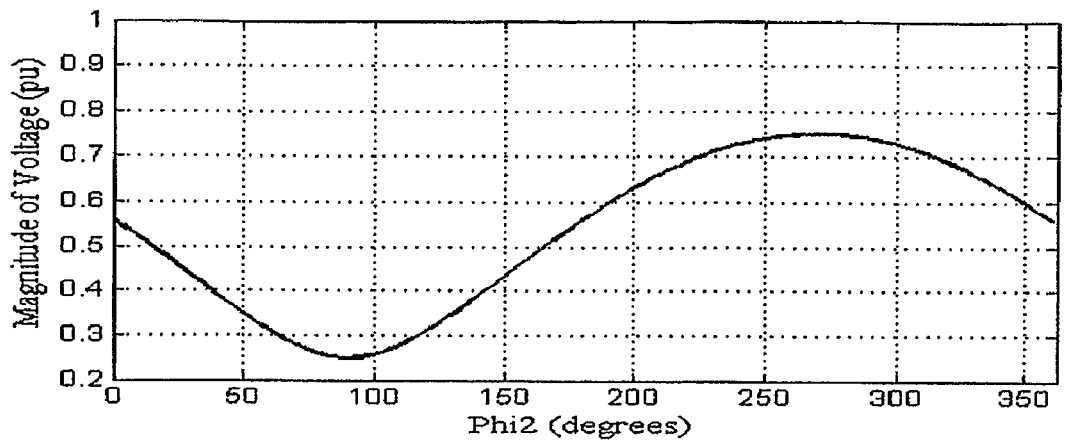
FIG. 8A shows the effect of the phase angle of the second harmonic component on the magnitude of the fundamental component of the output voltage.
Figure 8B:
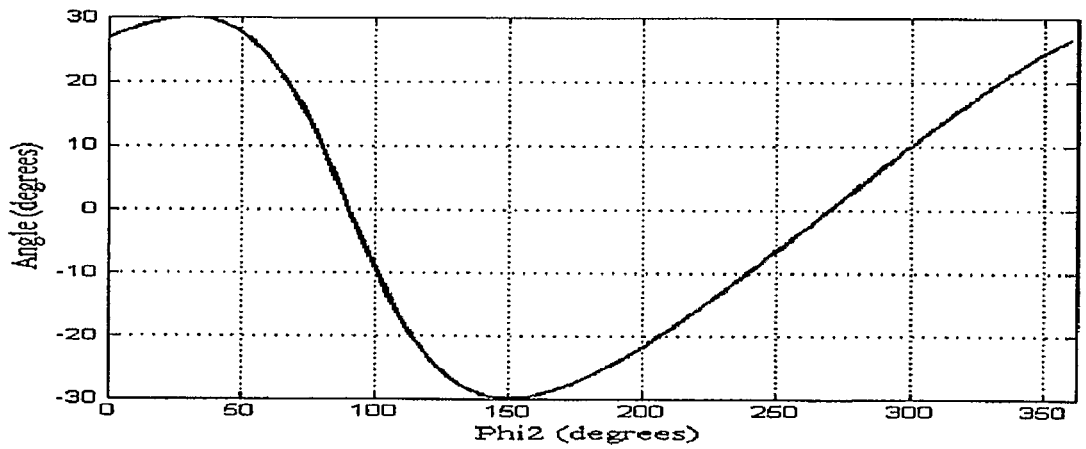
FIG. 8B shows the effect of the phase angle of the second harmonic component on the phase angle of the fundamental component of the output voltage.
Figure 8C:
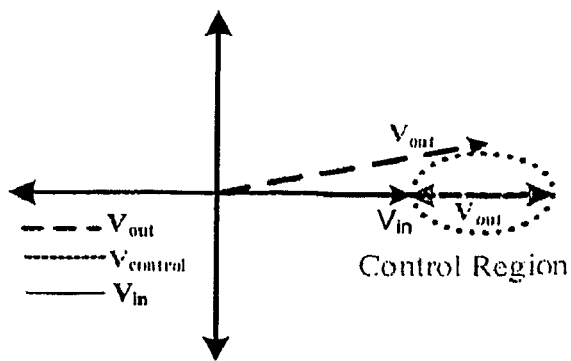
FIG. 8C shows an achievable control region in the d-q plane.

Operation principles for voltage synthesis using virtual quadrature sources (VQS) may now be discussed. Assume that the incoming line voltage is $V_{in}$, aligned with the 'direct' or 'd' axis. For a desired output voltage, $V_o^*$, which is phase shifted by angle $\phi$ with respect to the input, the sum of two voltages can be used to effectively describe the voltage, a direct component $V_{do}^*$ and a quadrature component, $V_{qo}^*$. The sum of $V_{do}^*$ and $V_{qo}^*$, which is the desired output voltage, and the input voltages illustrated in FIG. 7A show that the voltage synthesis constraint is violated. To ensure the physical constraints on the system are satisfied at all times, a second quadrature source at an odd harmonic (e.g. triplen) say the $3^{rd}$, is added, as shown in FIG. 7C. The resultant voltage $V_o^*$, plotted in FIG. 7C, is now lies entirely within the envelope provided by the incoming voltage $V_{in}$, and can thus be synthesized. The voltage $V_o$, after synthesis, may comprise a direct and quadrature component of the fundamental voltage, as well as a $3^{rd}$ harmonic voltage. In a three-phase system, it may be possible to block or filter the $3^{rd}$ harmonic with no deleterious effect. An alternative approach could treat the harmonic as the controlled variable, with the quadrature component being the uncontrolled variable.

The physical constraints on the system can be illustrated analytically as follows. If the incoming voltages $V_{in}$ and $V_o^*$ are as given in Equations 1 and 2.

$$V_{in} = V_m \sin\theta \tag{1}$$

$$V_o = V_{do} \sin\theta + V_{qo} \cos\theta + V_3 \sin(3\theta + \phi_3) \tag{2}$$

One can then set up the physical constraints on $V_o^*$ as follows:

$$0 < V_o^*(\theta) < V_m \sin\theta \quad 0 < \theta < \pi$$

$$0 > V_o^*(\theta) > V_m \sin\theta \quad \pi < \theta < 2\pi$$

Matching the input and desired output voltages at $\theta=0$ gives $$V_{qo} = V_3 \sin\phi_3 \tag{3}$$

If the variable to be controlled is $V_{qo}$, then setting ($\phi_3 = \pi/2$) yields the minimum level of $3^{rd}$ harmonic that must be injected to realize the desired control. This then allows a computation of the duty cycle as a function of time (angle) to be, $$D(\theta) = \frac{V_0^*}{V_m} = \frac{V_{do}}{V_m} + \frac{V_{qo}}{V_m}\cot(\theta) - \frac{V_3}{V_m}\frac{\cos(3\theta)}{\sin\theta} \tag{4}$$

It is seen that there is a DC component of the duty cycle, and a time varying component. The expression for $D(\theta)$ can be simplified to yield a simpler relationship $$D(\theta) = \frac{V_{do}}{V_m} + \frac{2V_{qo}}{V_m}\sin(2\theta) \tag{5}$$

This finding then suggests that a simpler real-time modulation strategy may be possible that will provide the same degree of control that can be achieved using the voltage synthesis technique described above. One example of such a strategy, referred to as even harmonic modulation, is shown below. Since triangle PWM is used, with the control reference voltage $V_c$ comprising a DC component to synthesize the desired $V_{do}^*$, and with a second harmonic of amplitude $K_2$ and phase angle $\phi_2$ as shown.

$$D(\theta) = K_0 + K_2 \sin(2\theta + \phi_2) \tag{6}$$

The resulting chopper output voltage is obtained by multiplying $D(\theta)$ with the input voltage to yield $V_o$, $$V_0 = V_m \sin(\theta) \cdot (K_0 + K_p \sin(2\omega t + \varphi_2)) \tag{7}$$

$$= V_m K_0 \sin(\theta) + V_m \frac{K_2}{2}\cos(\theta + \varphi_2) - V_m \frac{K_2}{2}\cos(3\theta + \varphi_2) \tag{8}$$

It is now seen that the output voltage contains $V_{do}$, $V_{qo}$ and a third harmonic component $V_3$ at an angle $\phi_3$. Further, it is possible to use other even harmonics in Eqn 6, such as the $4^{th}$ harmonic, to generate the desired $V_{qo}$ as well as a component at the $3^{rd}$ and $5^{th}$ harmonic frequencies on the AC side. This shows that there are two possible control strategies that can be applied to achieve a desired output voltage. The first approach may be to obtain a desired quadrature component which, when summed with $V_{do}$, may result in the desired phase shifted output voltage. A second approach, to realize controlled harmonic levels, could also alternatively be implemented. To realize both control strategies, the following control variables can be used, $K_0$, $K_2$ and $\phi_2$. The effect of each variable on the phase angle and harmonic component can be seen from Eqn (9).

$$|V| = V_m \sqrt{\frac{K_2^2}{4} - K_0 K_2 \sin\varphi_2 + K_0^2} \tag{9}$$

$$\varphi = \tan^{-1}\left[\frac{\frac{K_2}{2}\cos\varphi_2}{K_0 - \frac{K_2}{2}\sin\varphi_2}\right]$$

$$V_3 = -\frac{K_2}{2}\cos(\omega t + \varphi_2)$$

Equation (9) shows that an arbitrarily phase shifted fundamental voltage as well as a controllable harmonic voltage can be generated by controlling the variables $K_0$, $K_2$ and $\phi_2$. The control limits are defined as $0 < D(\theta) < 1$. FIG. 5A through 5C illustrates the effect of the phase angle of the second harmonic component on the magnitude and phase angle of the fundamental component of the output voltage. The control contours illustrate the maximum achievable phase angle and the range of control of the voltage magnitude. This is achieved by setting $K_0 = K_2 = 0.5$, and varying $\phi_2$. One desirable feature is the linear control range that allows the use of $\phi_2$ as a control variable. The achievable control region in the d-q plane is illustrated in FIG. 5C.

Embodiments of the invention allow the use of a simple AC chopper (e.g. FIG. 3A) with a sinusoidal AC source, and allows the generation of an output voltage with a desired amplitude, phase angle, and/or harmonic content by trading off between a fundamental frequency and a harmonic frequency quadrature source. The desired control is seen to be achieved without any large AC capacitors or inductors, and does not require the use of a DC/AC inverter. Filtering of high frequency PWM may be used.

Figure 9:
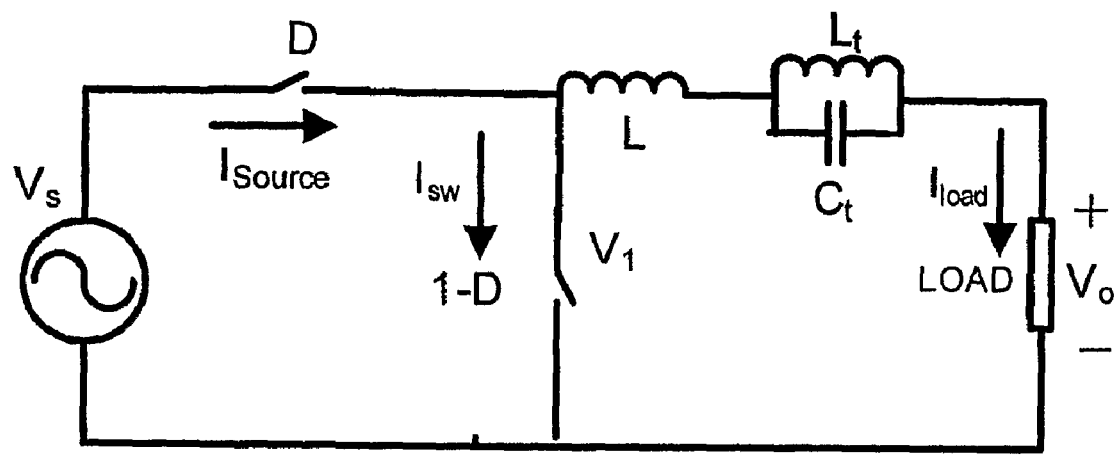
FIG. 9 shows an EHMACC circuit.

Potential Applications will next be discussed. In applications where phase angle of the voltage at the fundamental frequency $V_0$ is of primary importance, the generated harmonic needs to be trapped or circulated, whereas in applications where the harmonic control is desired, the phase shift at the fundamental frequency has to be tolerated. It is seen that many applications can be defined, even with the above limitations. Applications for reactive and harmonic compensation have been discussed in more detail below. The application dealt with here illustrates phase angle control of the fundamental output voltage. FIG. 9 shows an EHMACC circuit that can be used for the same with $3^{rd}$ harmonic trap. To achieve the desired output voltage the switches may be modulated using even harmonic modulation (EHM), as discussed above, and the scheme is simulated to illustrate the maximum achievable phase shift. A third harmonic trap may be included to trap undesirable third harmonic voltage, which is a by-product of the proposed technique.

Figure 10A:
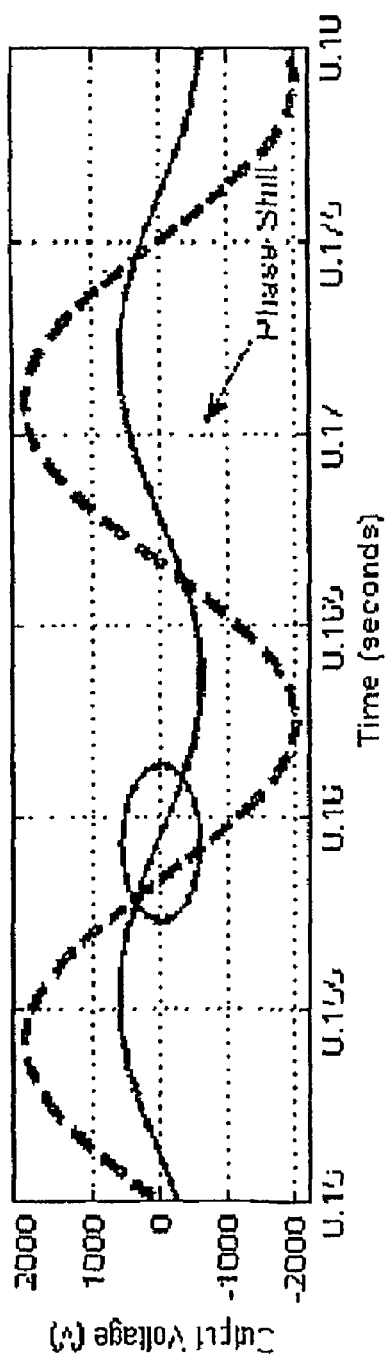
FIG. 10A shows the input and output voltage of the EHMACC of FIG. 9 with the phase shifted output voltage at an angle.
Figure 10B:
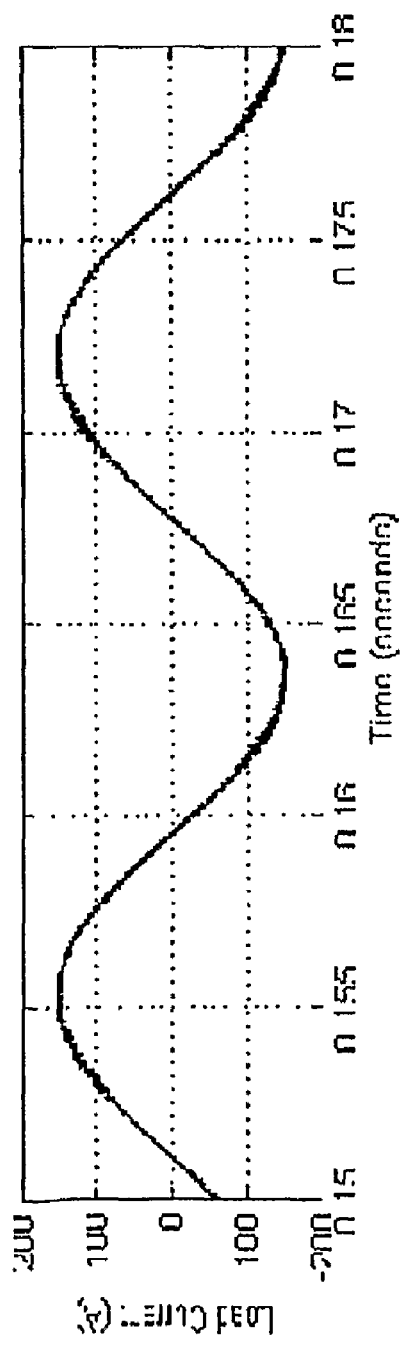
FIG. 10B shows the input and output voltage of the EHMACC of FIG. 9 with the phase shifted output voltage at an angle.
Figure 10C:
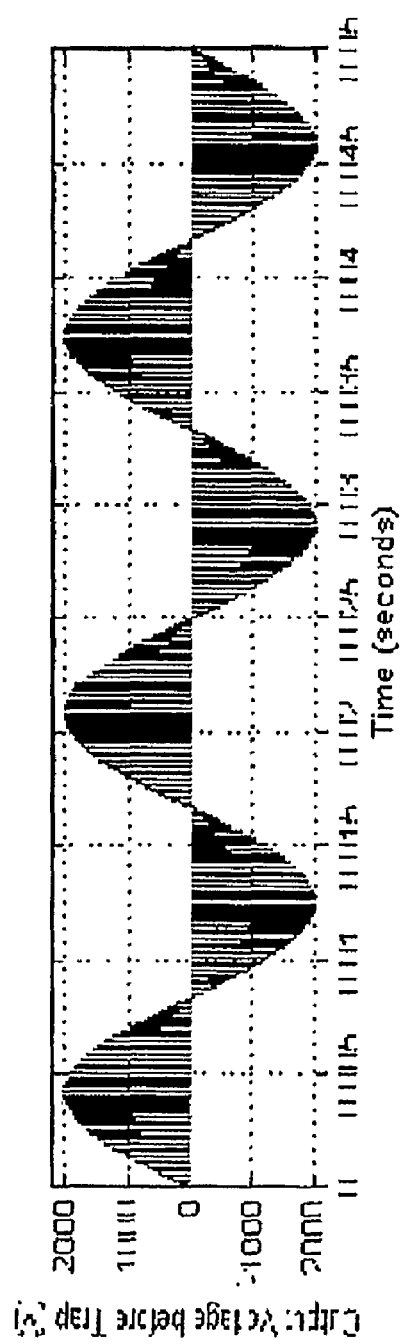
FIG. 10C shows the input and output voltage of the EHMACC of FIG. 9 with the phase shifted output voltage at an angle.
Figure 10D:
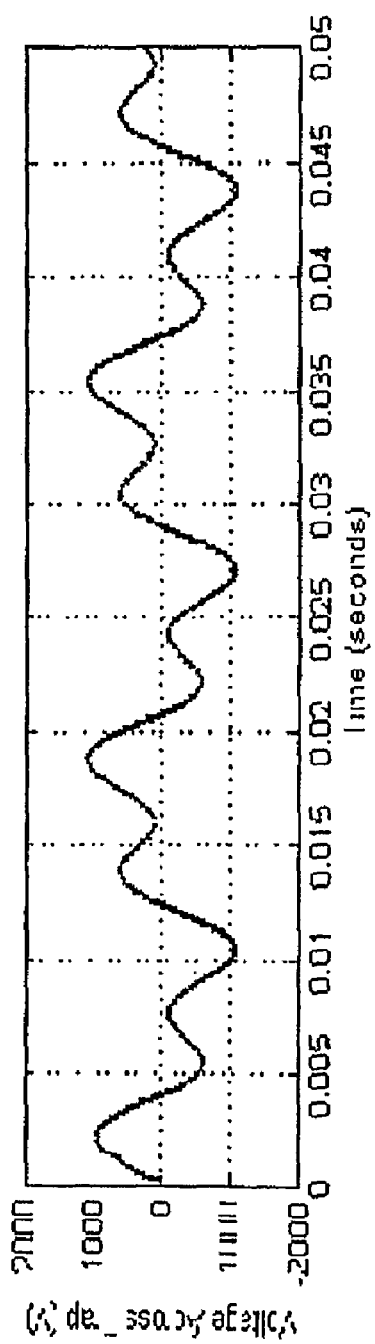
FIG. 10D shows the input and output voltage of the EHMACC of FIG. 9 with the phase shifted output voltage at an angle.

The phase angle of the fundamental component, which is the desirable variable, may be achieved by invoking the two quadrature sources, one at the fundamental and the second at the $3^{rd}$ harmonic, both with amplitudes 0.5 pu to achieve maximum phase shift of 30 degrees. FIG. 10A through 10D shows the input and output voltage of the EHMACC with the phase shifted output voltage at an angle of 25 degrees with respect to the input. The loss of 5 degrees is due to the third harmonic trap that has been included in the scheme. The voltage, $V_1$ at the output of the two-switch pair is shown in FIG. 10C, this voltage has a fundamental component of 860V and a phase shift of 30 degrees. The voltage across the $3^{rd}$ harmonic trap is shown in FIG. 10D. The ability to generate a phase shift with no additional sources using a minimal component scheme (EHMACC) has been illustrated.

Figure 11A:
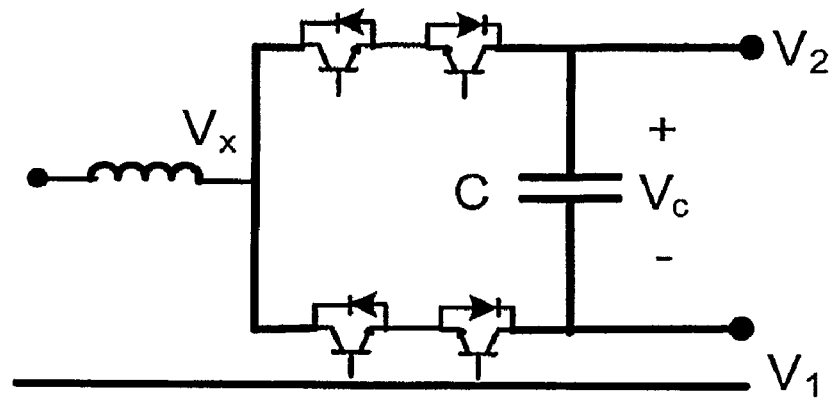
FIG. 11A shows an AC-AC chopper with an arbitrarily phase shifted output voltage and controllable voltage magnitude.
Figure 11C:
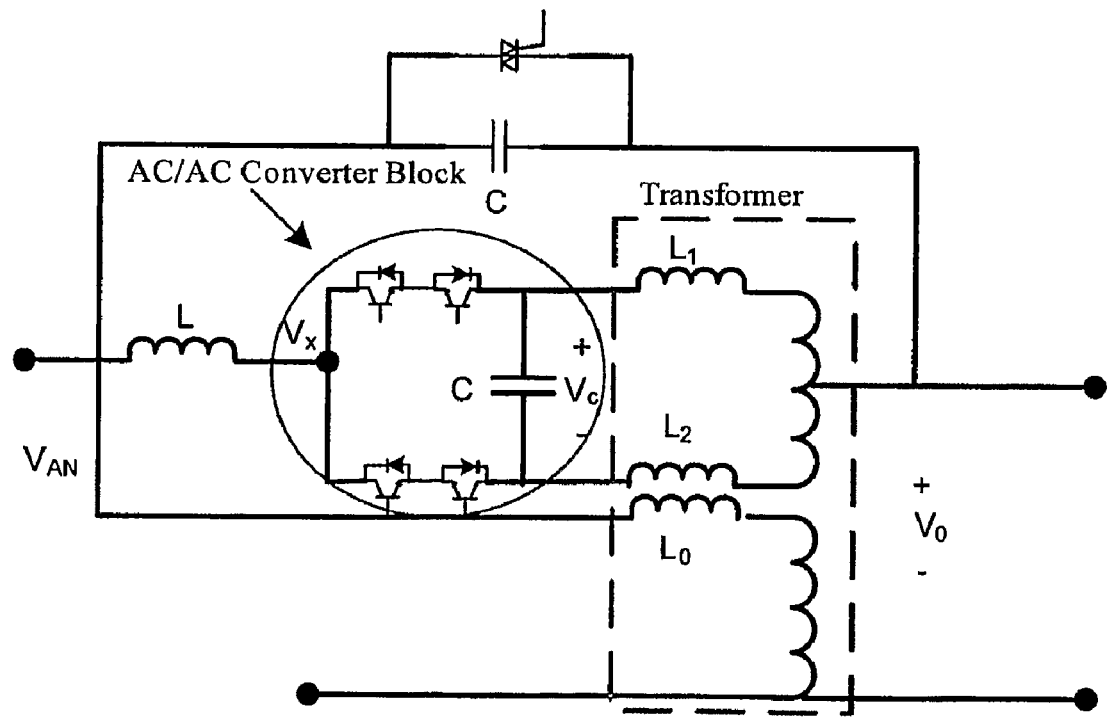
FIG. 11C shows an example topology for the phase and amplitude controllable transformer (PACT)
Figure 11B:
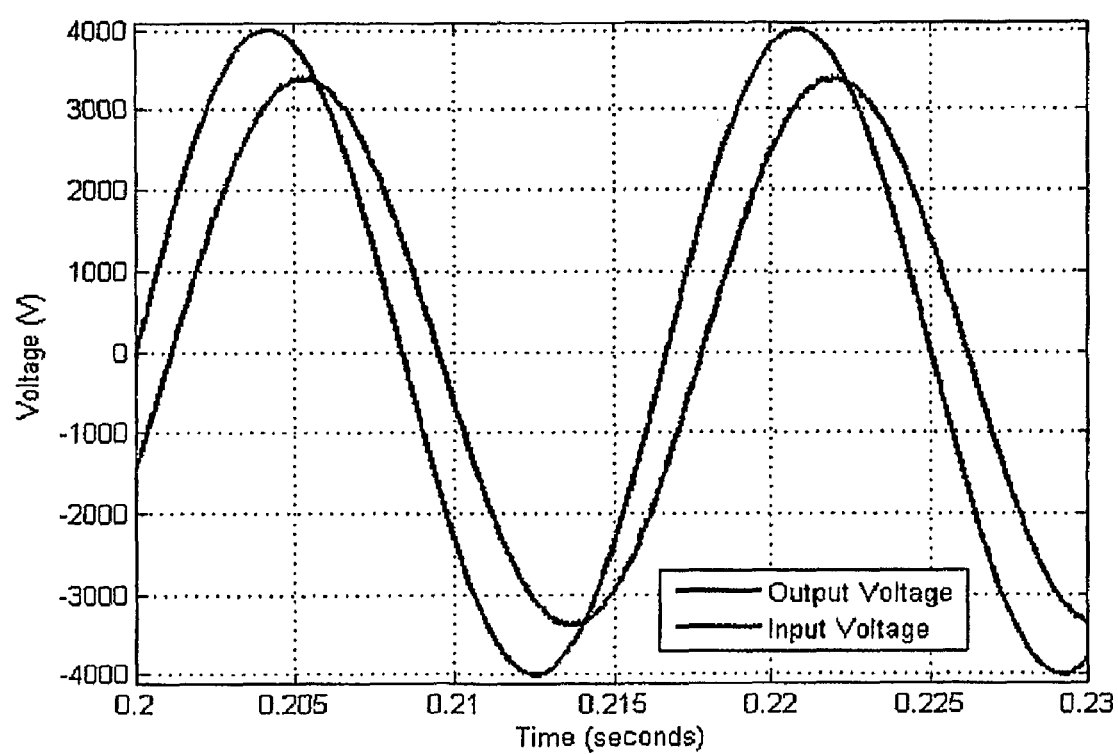
FIG. 11B shows a sample output.

Consistent with embodiments of the invention, dual virtual quadrature sources (VQS) may be used to realize a phase and amplitude controllable transformer (PACT). FIG. 11A shows AC-AC chopper with an arbitrarily phase shifted output voltage and controllable voltage magnitude. FIG. 11B shows a sample output. FIG. 11C shows an example topology for the PACT. For example, one embodiment of the PACT is shown in FIG. 11A. As voltage amplitude control is required over a small range in power networks, usually about ±10% of the nominal voltage, control over the entire voltage range of the network 0-1.0 pu may not be required. The PACT can be designed for the desired range of voltage amplitude control, ±10% of the nominal voltage, which in turn may reduce switch ratings and in turn, overall cost. The control of the voltage amplitude and phase of the PACT may be achieved by adding an AC chopper to a conventional tapped transformer. The level of control used may determine the rating of the AC chopper. The basic operation of the AC chopper as well as the topology of the PACT is illustrated in FIG. 11A through FIG. 11C.

The aforementioned VQS process may be used with the embodiment shown in show in FIG. 11A through FIG. 11C to generate an output voltage with controllable phase and/or harmonic content. To synthesize an output voltage of variable phase/harmonic content, additional sources are required in conventional systems that provide the required energy at the zero crossings of the input voltage. A voltage synthesis technique consistent with embodiments of the invention may be applied to realize the output voltage with variable phase and/or harmonic content, where two virtual sources are invoked in quadrature with the input voltage ($V_{do}$), one at the fundamental ($V_{qo}$) and the second at the third harmonic frequency ($V_3$). The sum of the three components should at all instants of time satisfy the physical constraints on the system.

Figure 12A:
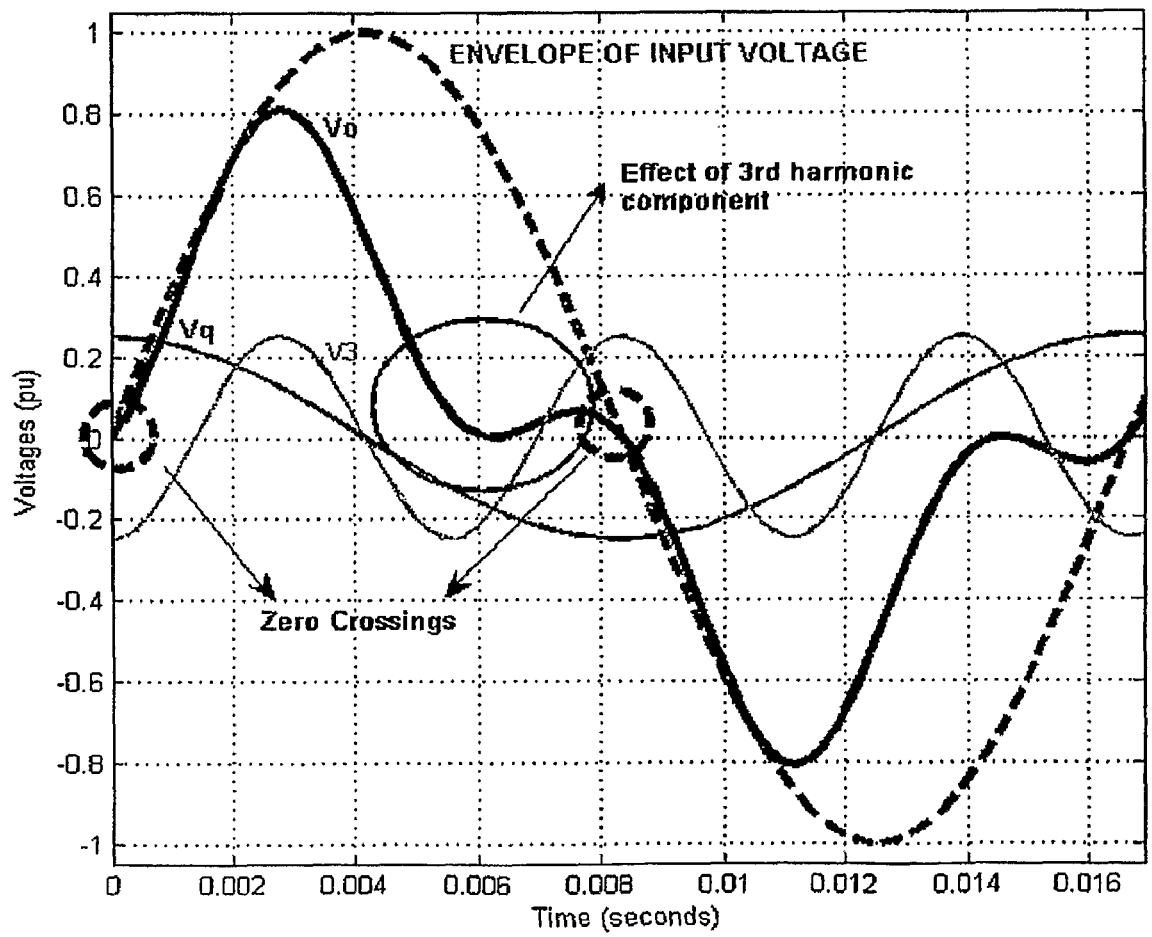
FIG. 12A shows voltage synthesis using dual virtual quadrature sources.
Figure 12B:
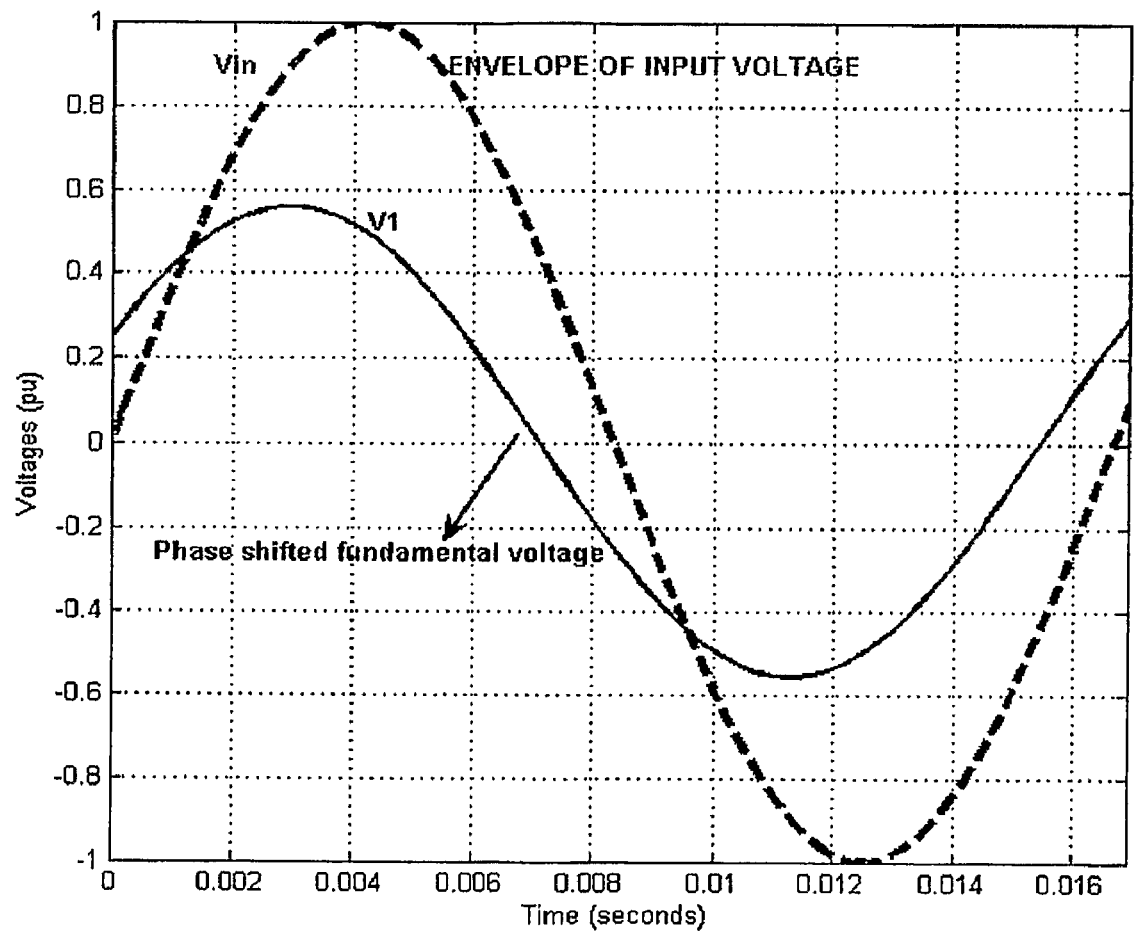
FIG. 12B shows a phase shifted voltage at the fundamental frequency.

FIG. 12A illustrates the concept of virtual quadrature sources, where the two virtual sources may be summed with the direct component of the voltage to result in a voltage that has controllable phase and/or harmonic content. The resultant voltage may lie within the envelop of the input voltage, thereby meeting the physical constraints on the system. The sum of the direct ($V_{do}$) and quadrature ($V_{qo}$) components at the fundamental frequency results in a phase shifted voltage at the fundamental frequency, as shown in FIG. 12B. The concept of voltage synthesis technique used to generate the virtual quadrature sources can be implemented using a simple real time modulation strategy (Even Harmonic Modulation), the equivalence of the voltage synthesis technique and the concept of the real time modulation strategy has been described above.

In this strategy, sine triangle PWM may be used, with the control reference voltage consisting of a DC component to synthesize the desired $V_{do}$, and with a second harmonic of amplitude $K_2$ and phase angle $\phi_2$, which when multiplied with the input voltage results in two components of voltage, one at the fundamental and the second at the third harmonic frequency.

Using the concept of EHM, the output voltage ($V_O$) of the transformer can be expressed as a function of the input voltage ($V_S$), modulation signal (D) and tap ratio.

$$V_S = V_m \sin(\omega t) \quad (1)$$

$$V_o = (1+N)(1-D)V_S + D(1-N)V_S \quad (2)$$

With the modulation signal given by (3), $$D(\theta) = K_0 + K_2 \sin(2\theta + \phi_2) \quad (3)$$

Figure 13A:
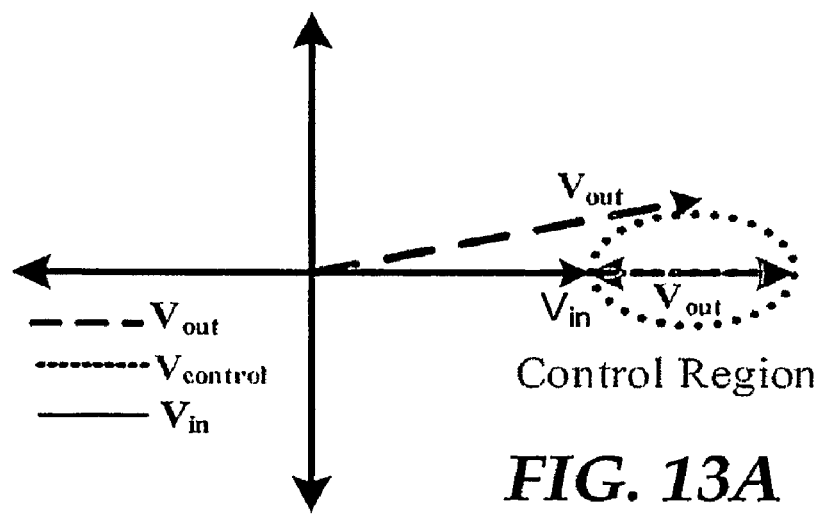
FIG. 13A shows a range of achievable phase angle control.
Figure 13B:
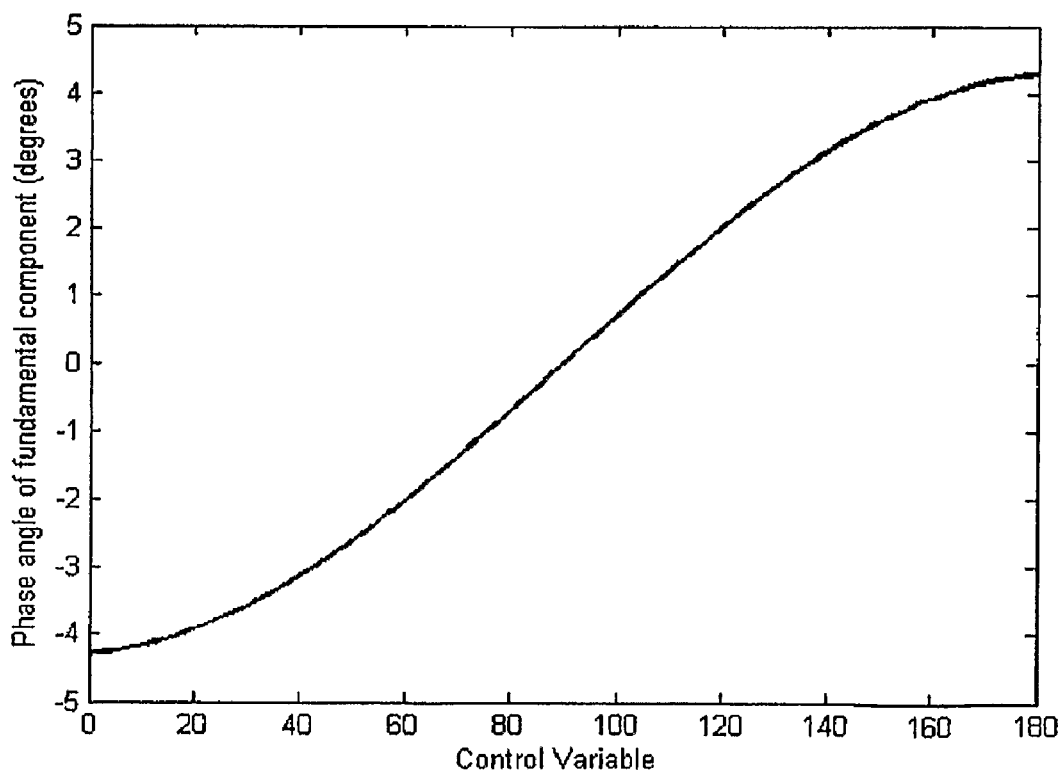
FIG. 13B shows variation of the phase angle with a control variable.

A desired component, for example, may be the quadrature (to generate an arbitrarily phase shifted output voltage), an undesired component may be the triplen, which can be trapped. To illustrate the range of control, the AC chopper may be rated at ±15% of the nominal voltage. FIG. 13A shows a range of achievable phase angle control. The maximum achievable phase shift for this rating is 5 degrees, significant for many power flow control applications. FIG. 13B shows variation of the phase angle with a control variable. The region of control is shown in FIG. 13A, shown by the ellipse. A larger rating of the AC chopper would enable a larger control region, however, cost may be a factor in the selection of the rating of the chopper.

Figure 14A:
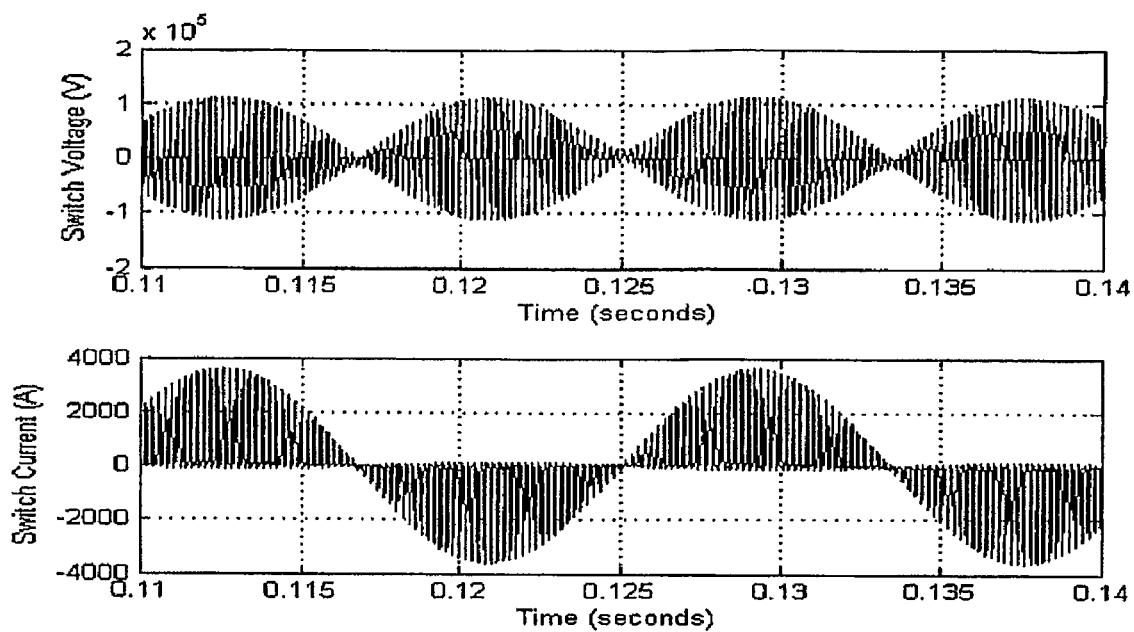
FIG. 14A shows switch voltage and current.
Figure 14B:
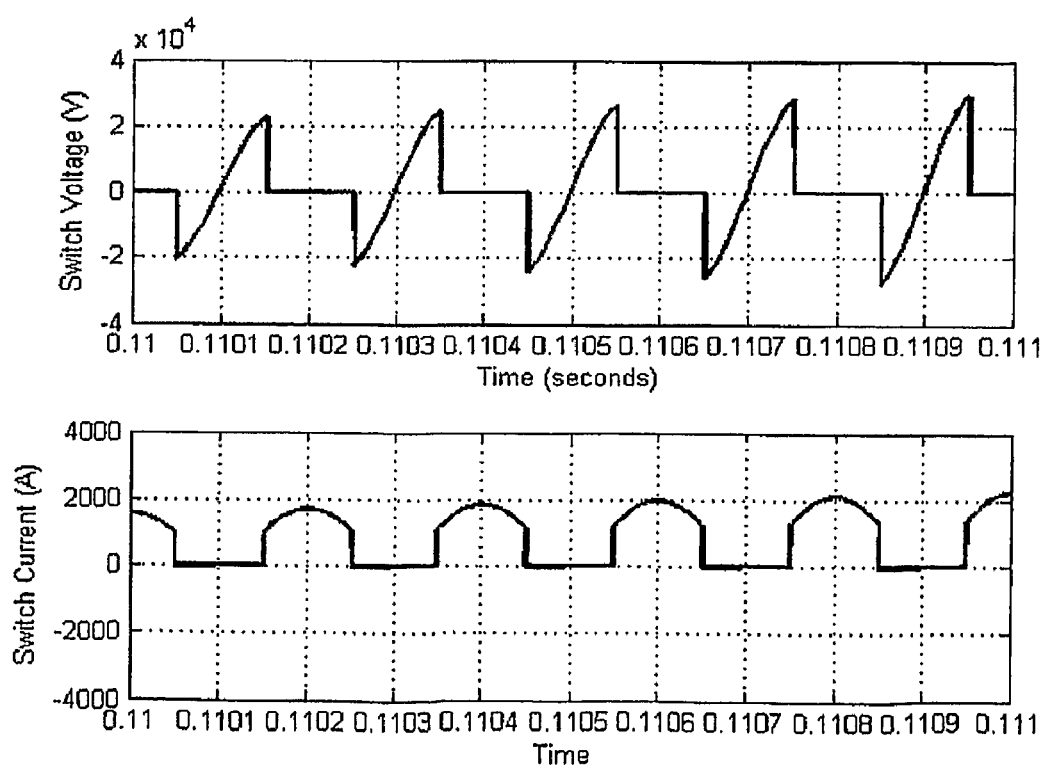
FIG. 14B shows switch voltage and current waveforms illustrating switching instances.
Figure 14C:
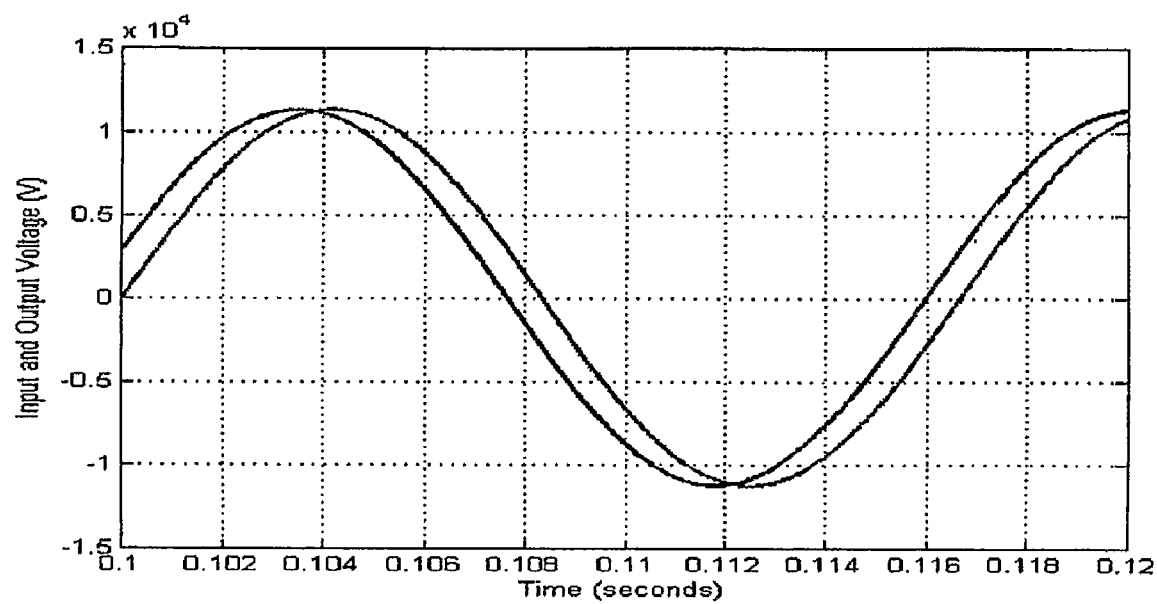
FIG. 14C shows input and output voltages.
Figure 14D:
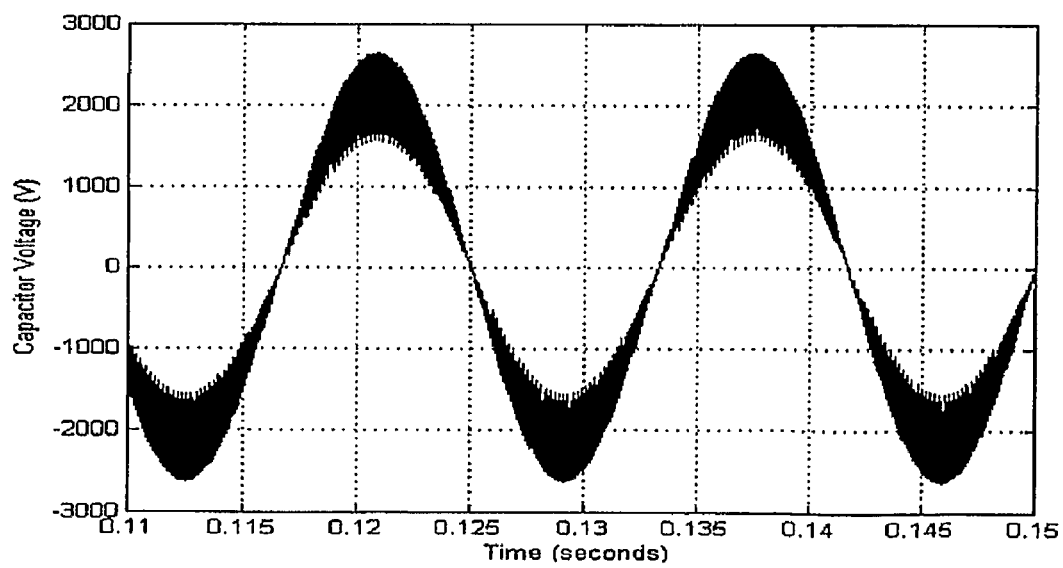
FIG. 14D shows capacitor voltage $V_c$.

FIGS. 14A through 14D show simulation results. To illustrate the performance of the proposed transformer, preliminary simulation results have been obtained. The AC chopper is rated at +10% of the nominal voltage. The transformer is simulated at a voltage level of the 138KV. FIG. 14A and FIG. 14B show the switch voltage and current. The switch voltage has a peak value of 35KV and the peak current is 2600 A. The actual switching instances are shown in FIG. 14B. FIG. 14C illustrates the input and output voltage of the controllable transformer, the phase shift generated between the input and output voltage is about 5 degrees. The capacitor voltage of the AC chopper is shown in FIG. 14D. The voltage has a peak value of 26KV, which agrees with the chosen tap ratio of 20% (±10%) of the nominal voltage.

Figure 15:
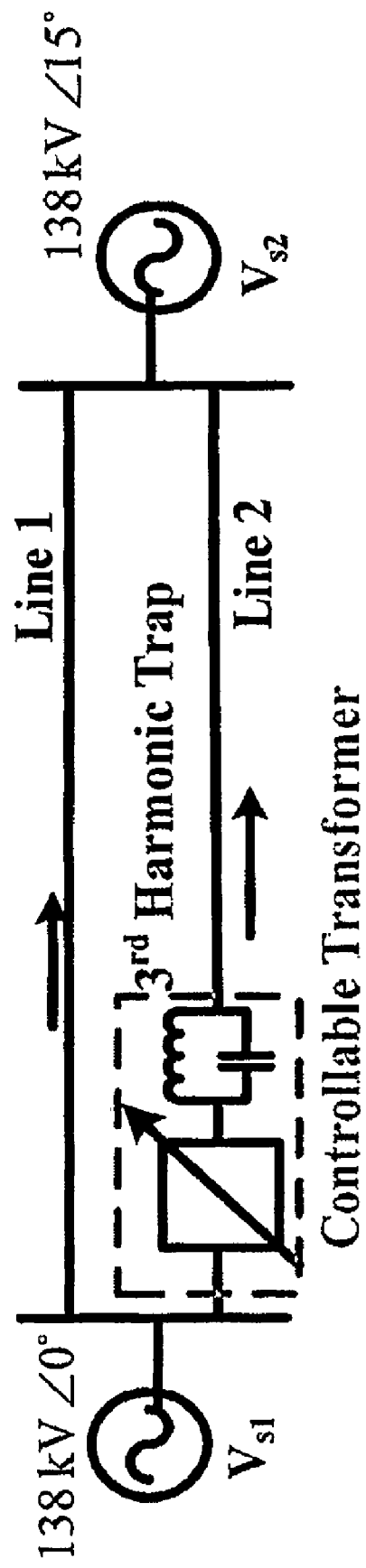
FIG. 15 shows a schematic of 2-bus system used to illustrate the operation of the PACT.
Figure 16A:
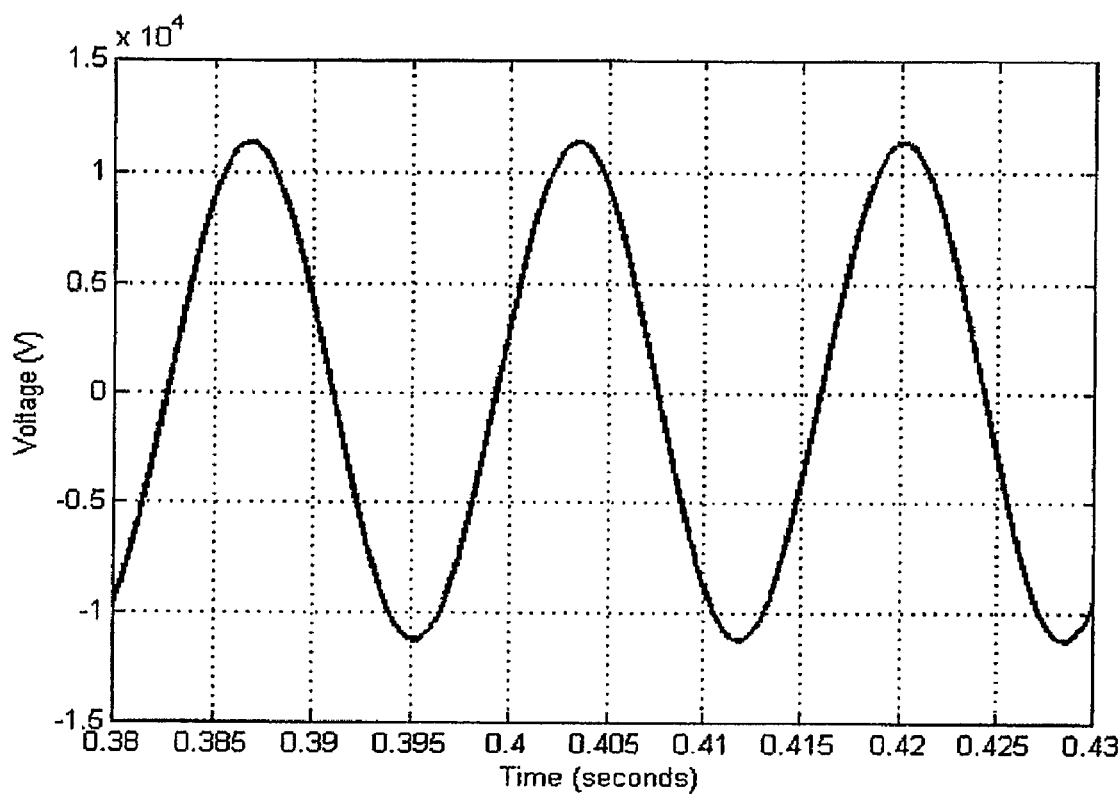
FIG. 16A shows line-voltage after $3^{rd}$ harmonic trap.
Figure 16B:
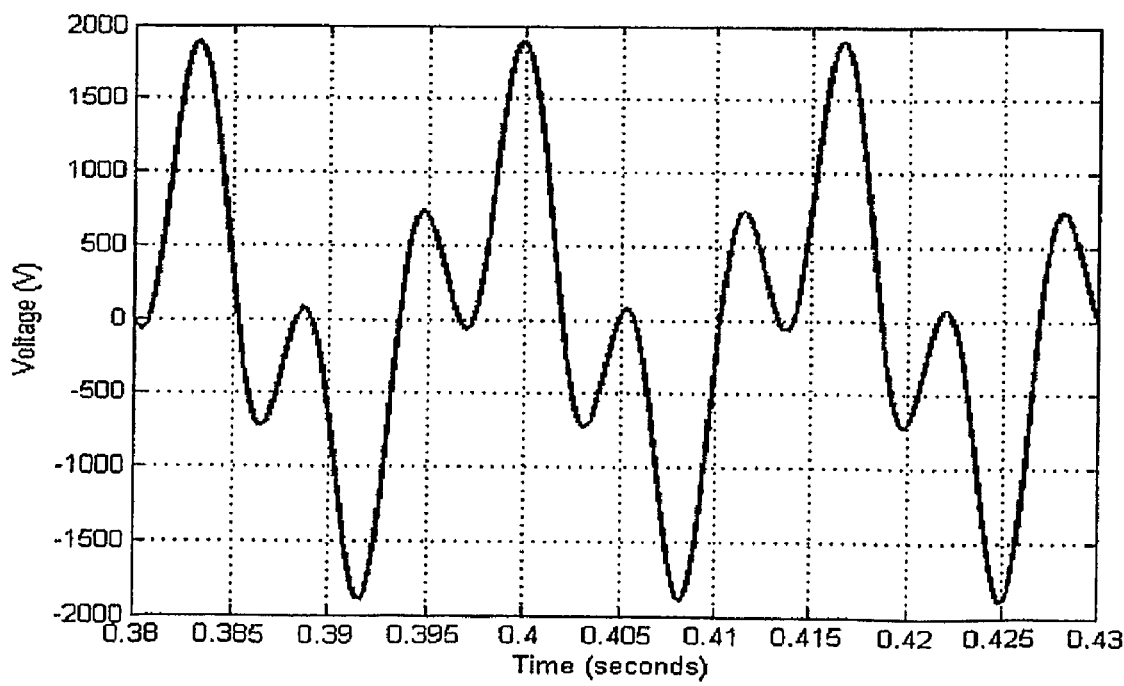
FIG. 16B shows voltage across the $3^{rd}$ harmonic trap.
Figure 16C:
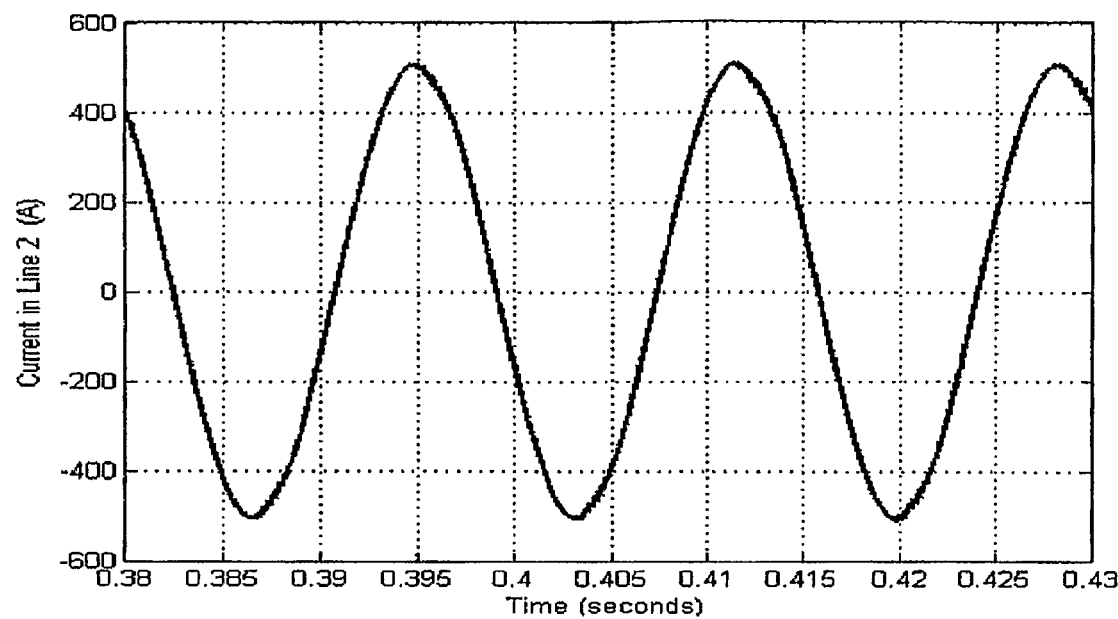
FIG. 16C shows line current.
Figure 16D:
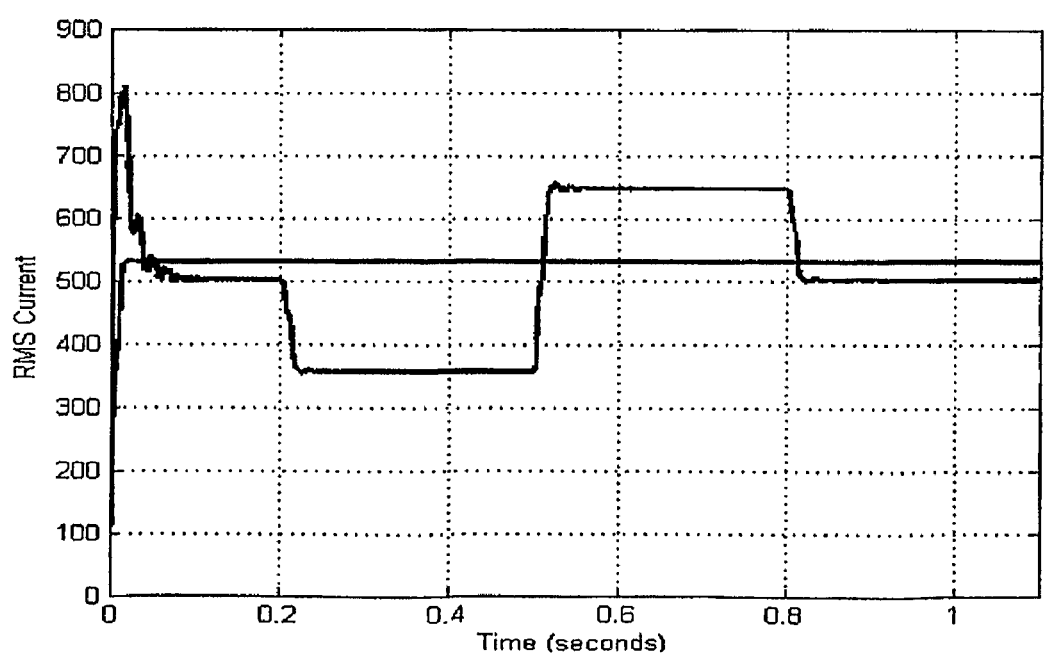
FIG. 16D shows RMS of the line current in line 1 and line 2

Preliminary simulations have been done to demonstrate the ability to control the flow of power in a simple 2 bus system, shown in FIG. 15. The system comprises two lines, one with the PACT to show power flow control and the second with no control. The nature of operation is illustrated by the waveforms shown in FIG. 16A through FIG. 16D. FIG. 16A shows line-voltage after $3^{rd}$ harmonic trap. FIG. 16B shows voltage across the $3^{rd}$ harmonic trap. FIG. 16C shows line current. FIG. 16D shows RMS of the line current in line 1 and line 2. As a by-product of the control method, a $3^{rd}$ harmonic voltage may be generated that is trapped as shown in FIG. 15. The voltage across the trap is shown in FIG. 16B. The line voltage, after the $3^{rd}$ harmonic trap is shown in FIG. 16A. The voltage can be seen to have no $3^{rd}$ harmonic component.

To verify the control capability of the transformer, the RMS current in the line has been illustrated in FIG. 16A through FIG. 16D. The transformer has been controlled to obtain maximum and phase shift, so as to increase and decrease the line current. The RMS current can be seen to decrease from 500 A down to 400 A and then increase to 600 A. The RMS of the line current in Line 1 however, remains constant over the entire period as the linear transformer provides no control.

Accordingly, embodiments of the invention may provide a phase and amplitude controllable medium voltage distribution transformer. The PACT may apply the concept of dual virtual quadrature sources to achieve simultaneous control of the voltage magnitude and phase angle. The operation of the transformer has been illustrated in a 2-bus system, showing control of the power flow in the line, but is not so limited.

Shunt active filters compensate for variable levels of harmonic currents generated by loads, essentially by producing currents in anti-phase with the offending harmonics. DC/AC inverters, with DC energy storage in electrolytic capacitors and high frequency PWM with IGBT switches, represent the most widely used technique for implementing active filters. As explained above, AC choppers may be used to invoke dual virtual quadrature sources to realize amplitude, phase angle and/or harmonic control on the available ac voltage. Consistent with embodiments, inverter-less active filters (ILAF) may be realized, using gate controlled semiconductor switches with inductors, capacitors, or existing resistive loads in a plant to realize dynamic VAR and/or harmonic compensation. The approach may be applicable for single and three phase systems. ILAF may provide lower cost and increased robustness and reliability when compared with conventional active filters.

Industrial plants may have varied loads including motor drives, lighting, automation equipment, and heater/furnace loads. Many of these loads may be non-linear and produce harmonic currents that can interfere with other loads and with other customers on the grid. Harmonic standards, such as IEC and IEEE 519, provide guidance on acceptable limits on harmonic levels. An ever changing network and load profile often make it difficult to apply passive harmonic filters.

Figure 17:
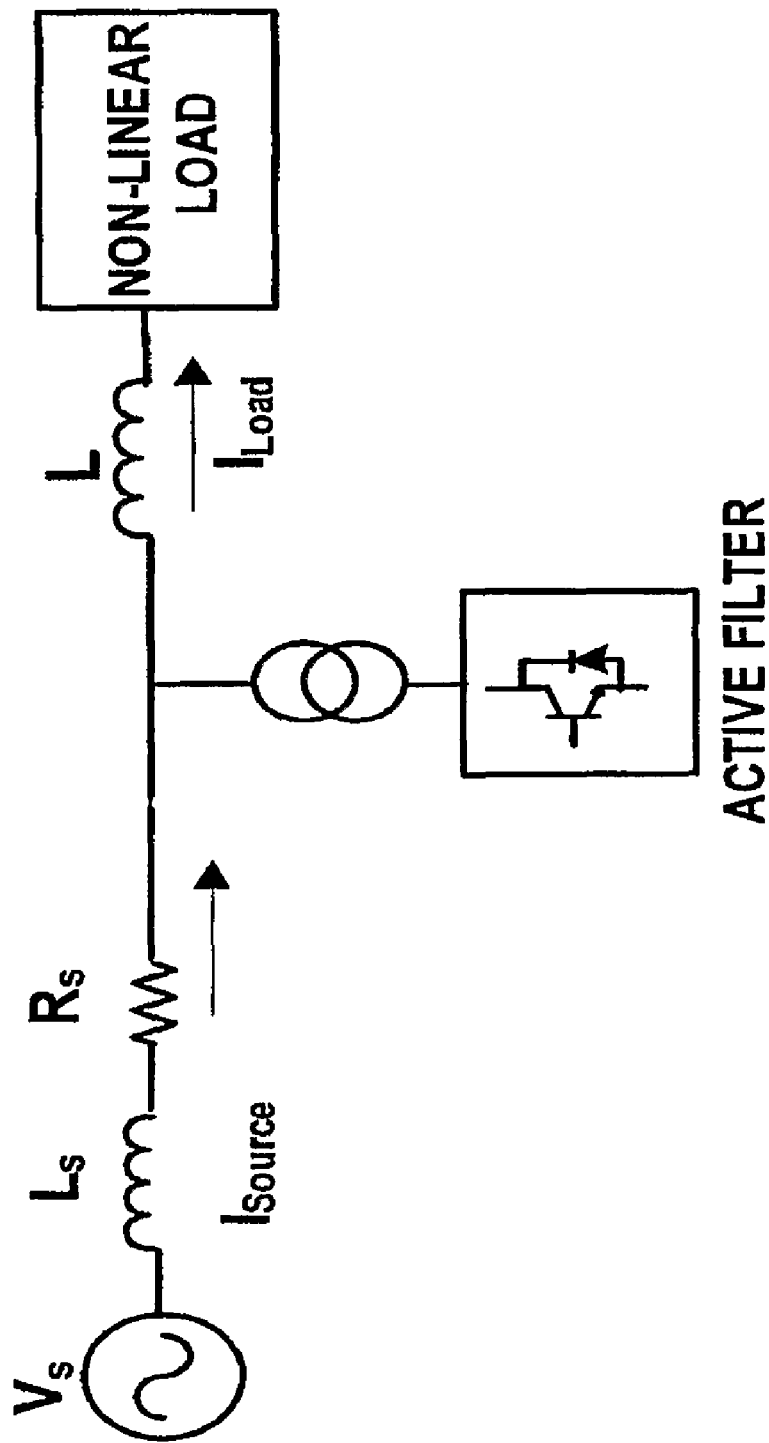
FIG. 17 shows a conventional active filter structure.

Conventional active filters may be based on DC/AC inverters, with shunt type filters used to compensate for harmonic currents generated by non-linear loads. FIG. 17 shows a conventional active filter structure. The load current may be measured and the harmonic currents extracted, using a synchronous frame regulator. An error loop maintains DC bus voltage on the voltage source inverter. The combined feedback signal is transformed back into the stationary frame, and yields the reference currents for the inverter. The inverter then generates the harmonic currents that compensate for the harmonics in the load. Conventional active filters generally provide well behaved harmonic compensation that is not susceptible to nearby capacitor banks and does not easily excite resonances.

Consistent with embodiments of the invention, active filters with no bulk energy storage and without inverters may be provided resulting, for example, in a simple topology and low cost. Active filters consistent with embodiments of the invention may comprise an AC chopper with an inductor or resistive load as the primary source of reactive and/or harmonic compensation currents. The ability to use an AC chopper to realize phase angle and/or harmonic control may be predicated on invoking dual virtual quadrature sources, as described above. The resulting line current drawn by the AC chopper may have controllable components along the 'quadrature' axis at the fundamental frequency, and at select harmonic frequencies. As described above, this control can be implemented using a real time control strategy involving even harmonic modulation. Embodiments of the invention may utilize this principles to provide inverter-less active filters.

Embodiments of the invention may work in case of a resistive inverter-less active filter (R-ILAF) using existing resistive loads. Such a resistive load already exists in many plants, and may be controlled to provide heat and/or light. The level of power delivered to the resistive load is normally controlled, often using a conventional thyristor AC voltage regulator. However, the resistive load normally provides no additional functionality.

Figure 18:
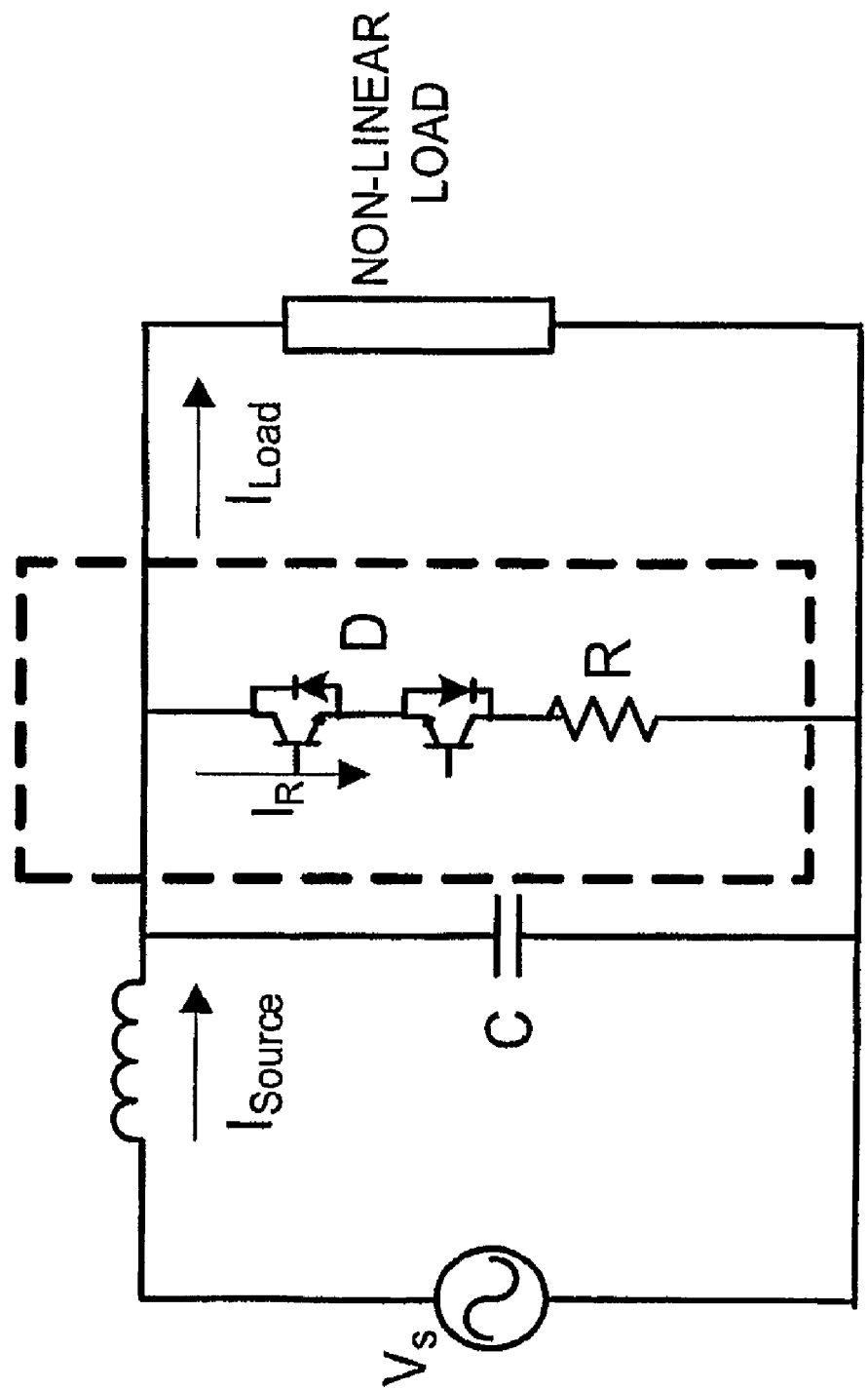
FIG. 18 shows a basic circuit topology for achieving the desired control.

Embodiments of the invention may provide a method for regulating the desired power to the resistive load, while at the same time providing plant level harmonic compensation. FIG. 18 shows a basic circuit topology for achieving the desired control. A simple one AC switch chopper in series with the switch may be used to regulate the effective duty cycle, and thus the power delivered to the load. A small low-pass LC filter may be used to filter out high frequency PWM content. If the switch is operated with a constant duty cycle D at a constant frequency F, the power delivered to the load is varied as:

$$P_0 = \frac{D^2 V_s^2}{R}$$

If this is the desired value of power to the load, it is seen that a simple duty cycle control is sufficient to achieve the needed power control function.

The switch S may be modulated with a duty cycle that has a constant component D, as well as a time varying component at an even harmonic frequency, such as the $2^{nd}$ harmonic.

$$D(\theta) = K_0 + K_2 \sin(2\theta + \phi_2) + K_4 \sin(4\theta + \phi_4) + \ldots$$

The voltage across the load resistor is now seen to be given by:

$$VR(t) = D(t) * Vm \sin wt =$$
$$= V_m K_0 \sin(\theta) + V_m \frac{K_2}{2} \cos(\theta + \varphi_2) - V_m \frac{K_2}{2} \cos(3\theta + \varphi_2)$$

VR(t) consists of a fundamental component and a $3^{rd}$ harmonic with a controllable phase shift, as well as frequency content at multiples of the AC switch switching frequency. As D(t) is varied, the power delivered to the load can be controlled.

The line current drawn by the load may comprise iR(t)=VR(t)/R. The amplitude of the $3^{rd}$ harmonic may be controlled by the amplitude of the $2^{nd}$ harmonic component, V2, and the phase of the $3^{rd}$ harmonic is dictated by the phase of the even harmonic, making the $3^{rd}$ harmonic current drawn by the resistor controllable. Similarly, by adding a $4^{th}$ harmonic to the modulation signal D(t), it may be possible to synthesize a $3^{rd}$ and $5^{th}$ harmonic current, which, when taken in conjunction with the $2^{nd}$ harmonic modulation already discussed, can provide compensation of the $3^{rd}$ and $5^{th}$ harmonic in the non-linear load. This may be extended to additional frequencies. It should be noted that with the principle of dual virtual quadrature sources, a reactive source at the fundamental frequency is automatically induced, even though no such reactive components have been used. This again shows that a resistor and switches can be used to emulate inductors, capacitors and active filters.

Consistent with embodiments of the invention, a representative plant with a non-linear load generating a third and fifth harmonic, as well as a linear resistive load rated at X MW may be provided. The level of THD of the harmonic current in the non-linear load is 26.95%, and may be reduced to 4.06% through action of the ILAF. Power to the load is maintained at X MW. Embodiments of the invention may provide a control method for tuning out the desired harmonics, and the ratings of the switches and high-frequency filters required.

Figure 19:
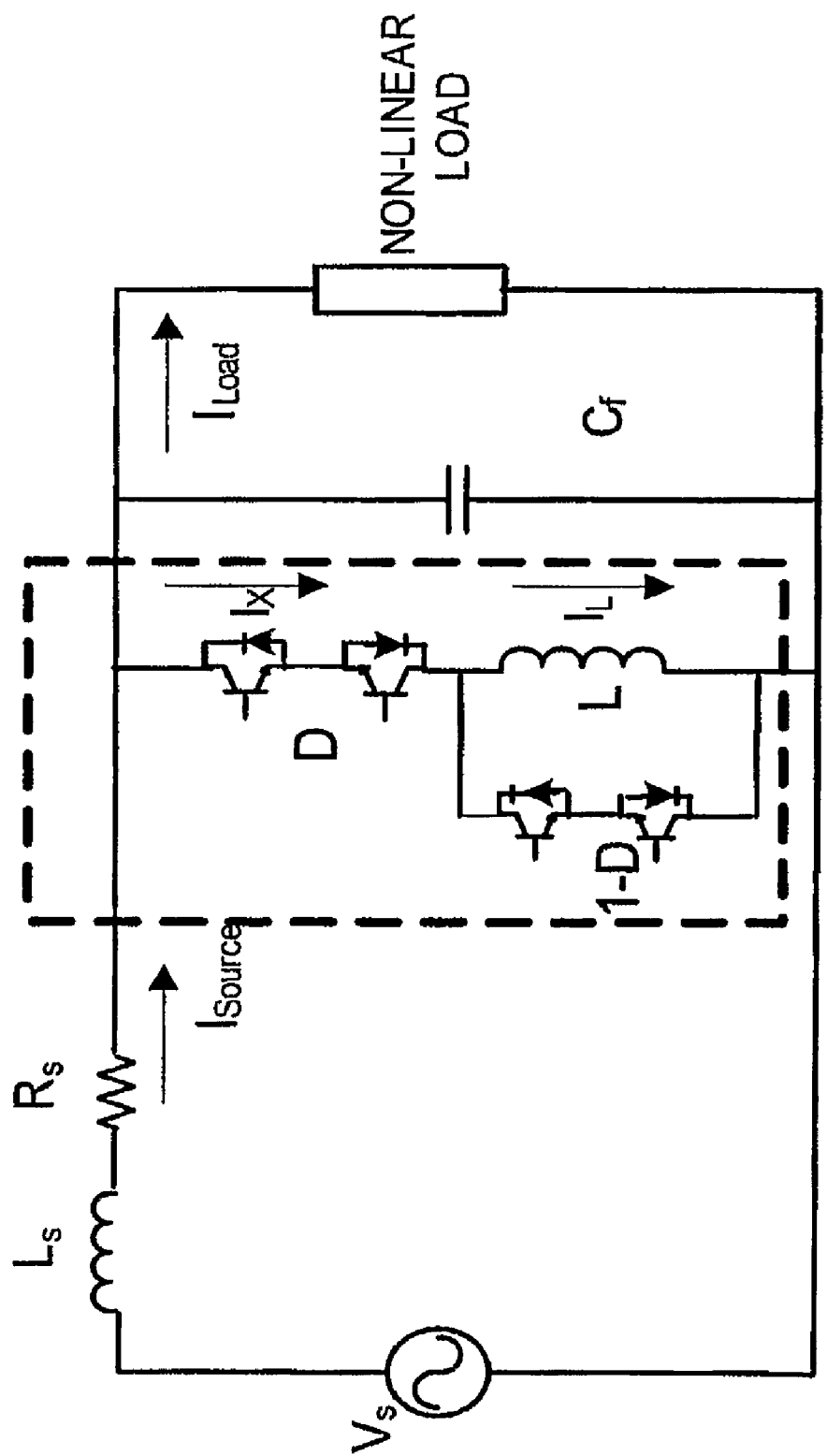
FIG. 19 shows an inductor version of an ILAF or L-ILAF.
Figure 20A:
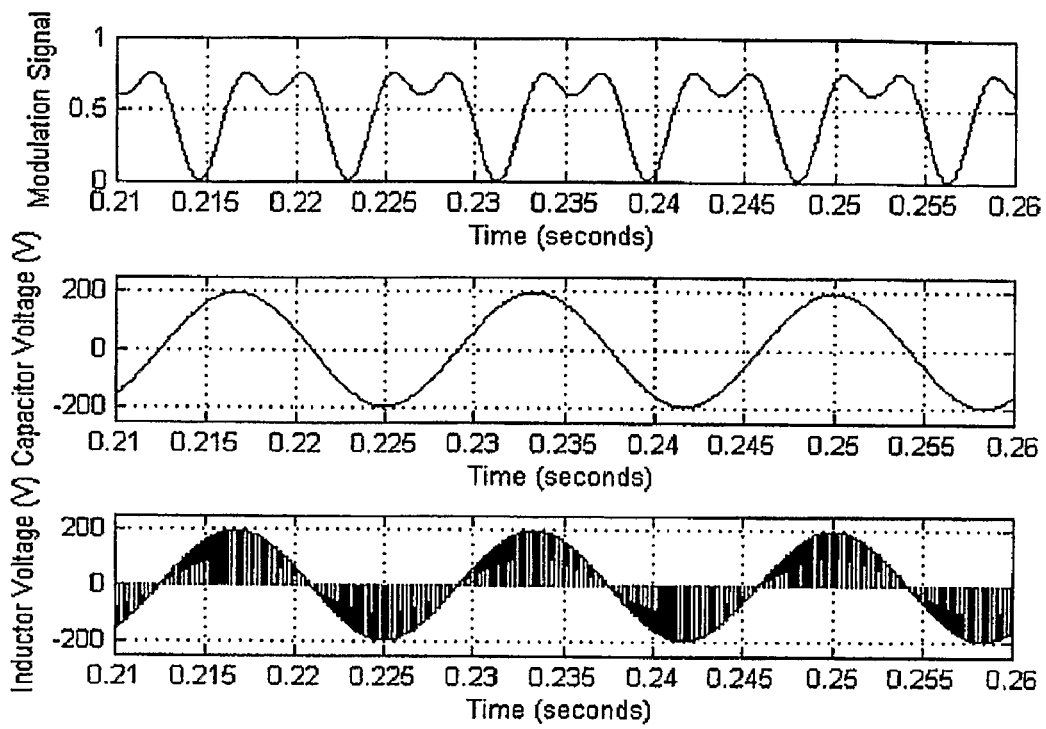
FIG. 20A through 20D show a simulation results for an L-ILAF.
Figure 20B:
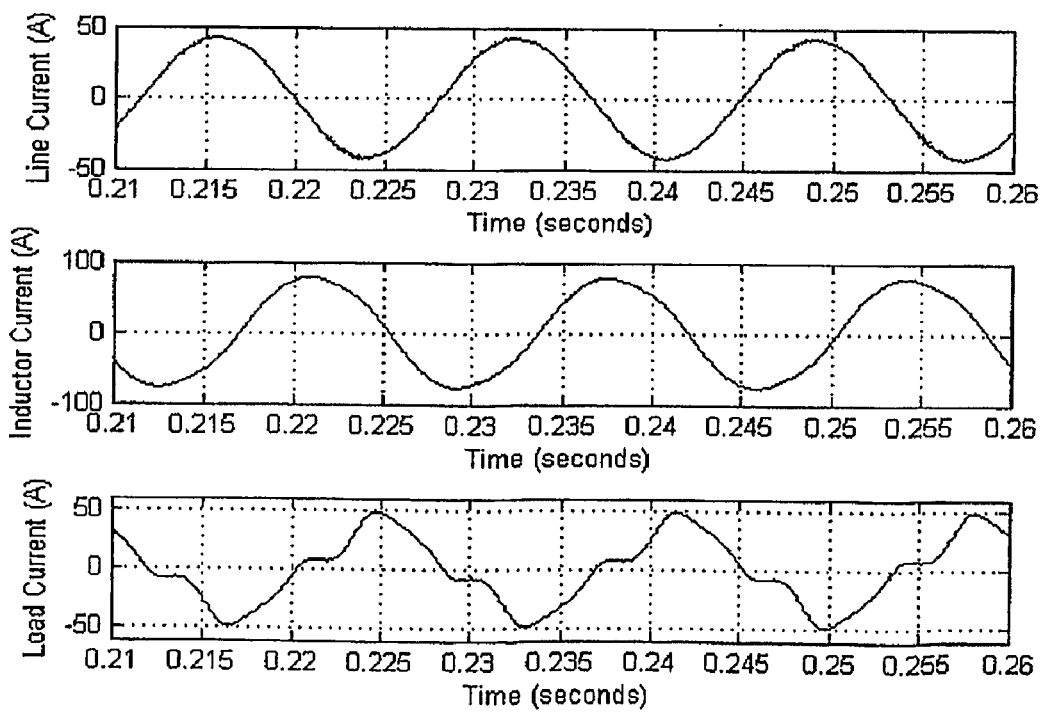
Figure 20C:
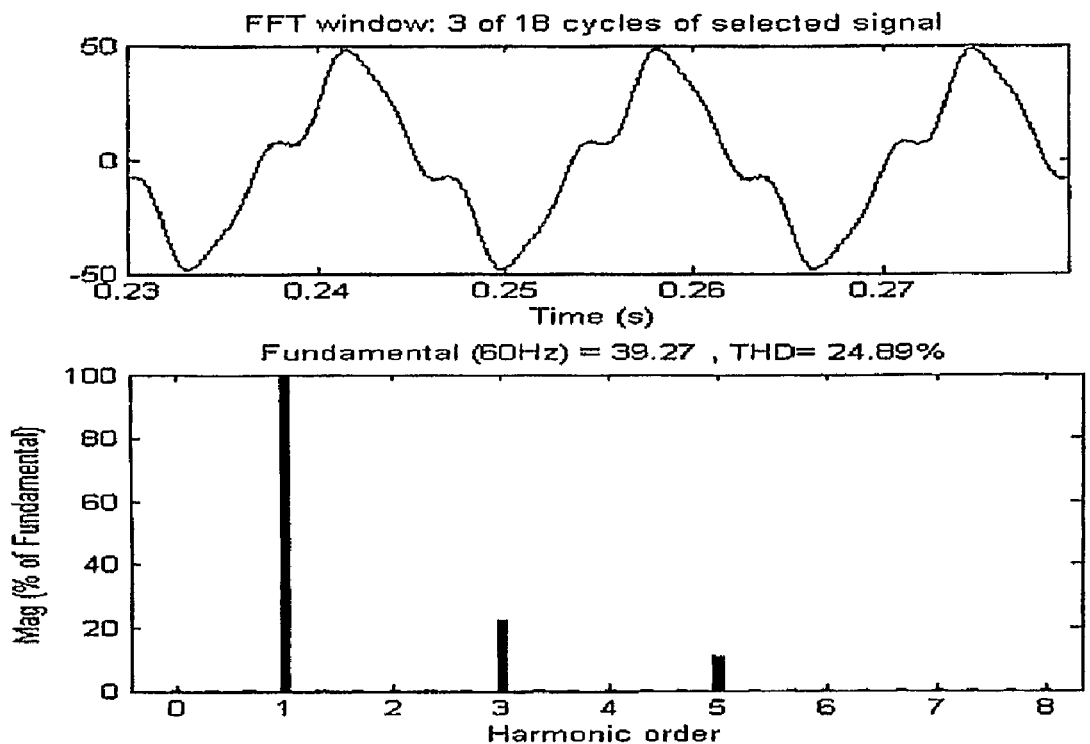
Figure 20D:
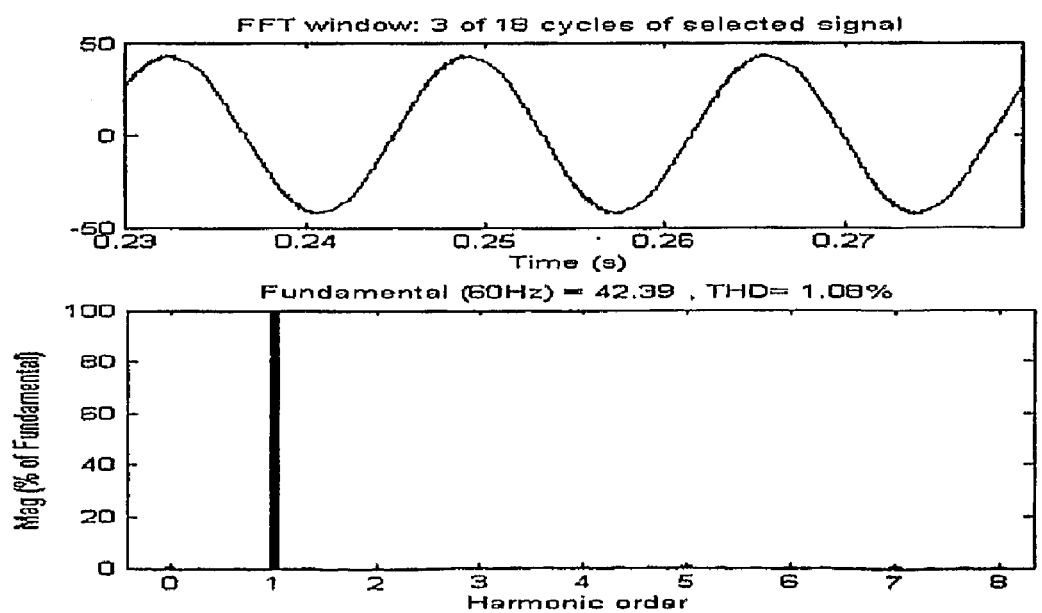

A similar ILAF can be realized using an inductor (L-ILAF) or capacitor (C-ILAF) along with an AC chopper. This system may be capable of providing fast varying dynamic VARs as well as harmonic control. As such, this capability is reminiscent of a STATCOM, but does not require inverters or DC bulk energy storage, and can operate on a single phase basis. FIG. 19 shows a inductor version of the ILAF or L-ILAF. Again, the switches may be modulated with a duty cycle D(t) that contains a DC component, representing the fundamental reactive VARs drawn by the ILAF circuit. Once again, the AC chopper duty cycle is modulated with an even harmonic.

$$D(\theta) = K_0 + K_2 \sin(2\theta + \phi_2) + K_4 \sin(4\theta + \phi_4) + \ldots$$

The inductor voltage may then be obtained by multiplying D(t) with the line voltage. The inductor current can then be calculated and may contain fundamental and $3^{rd}$ harmonic current. The inductor current (IX) may then be reflected back to the line through the AC chopper switching function to provide the spectral composition of the line current (IL) drawn by the AC chopper. It is seen that IL contains a $3^{rd}$ and a $5^{th}$ harmonic, as well as the fundamental component. Similarly, addition of a $4^{th}$ harmonic component will generate a $5^{th}$ and a $7^{th}$ harmonic. Overall control of the ILAF involves tuning the levels and phase angles of the even harmonic modulation components to realize the desired harmonic current levels in IL. FIGS. 20A through 20D show simulation results for the L-ILAF, with the non-linear load consisting of 25% of $3^{rd}$ and 10% of $5^{th}$ harmonic currents. The L-ILAF draws X MVAR of reactive VARS at the fundamental frequency, and compensates for the harmonics, yielding a line current THD of ~1.08% at the plant input.

Consequently, embodiments of the invention may provide active VAR and harmonic compensation using a family of inverter-less active filters or ILAFs. The filters may be based on the concept of realizing dual virtual quadrature voltage sources, trading off instantaneous energy between a harmonic and a fundamental frequency quadrature voltage, to realize the overall desired control. By eliminating the DC bulk energy storage, a lower cost system may be realized and the robustness and reliability of the system is significantly improved.

Figure 21:
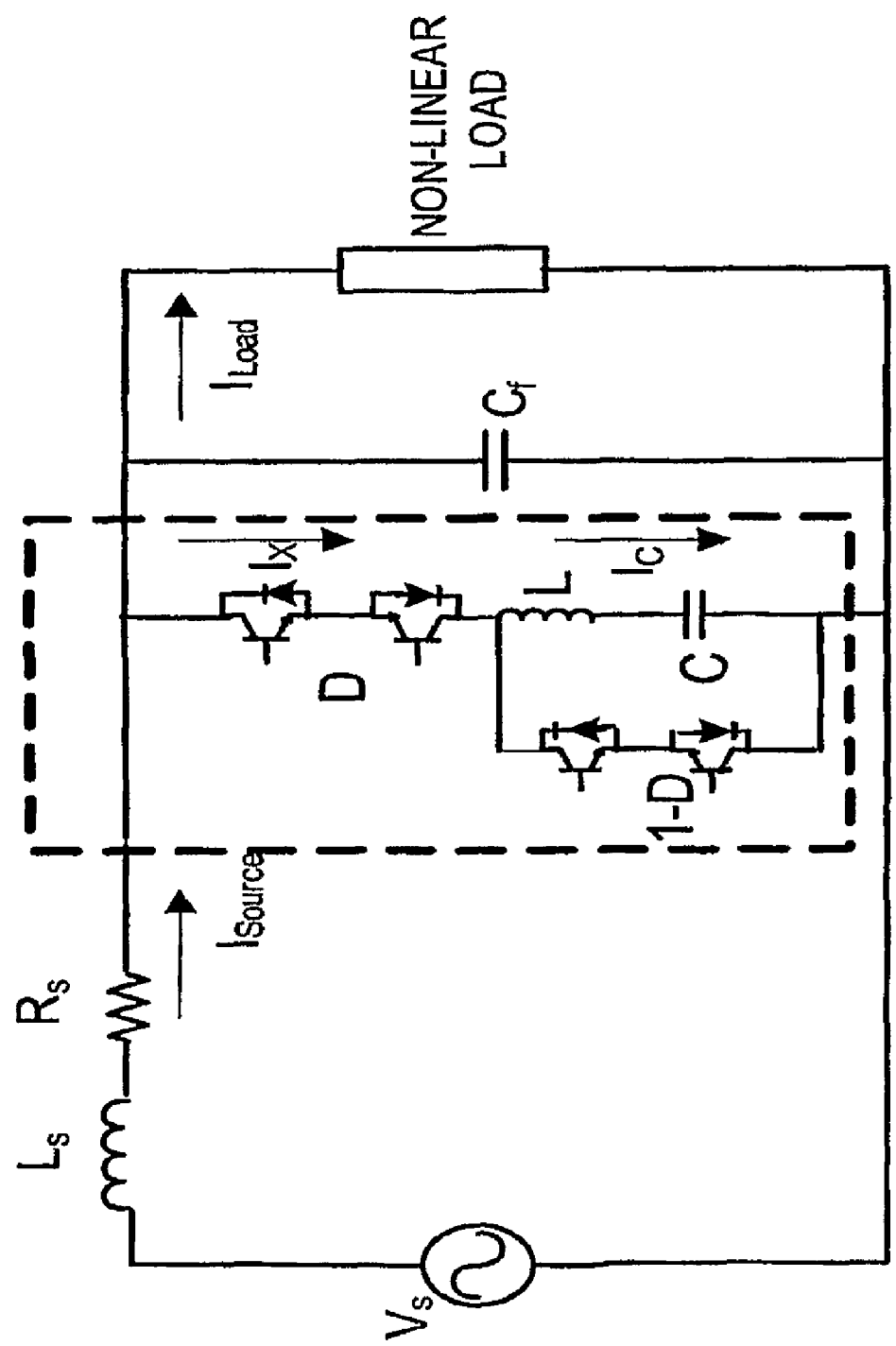
FIG. 21 shows a schematic of a capacitor inverter-less active filter (C-ILAF)

Consistent with embodiments of the invention, capacitor-inverter-less active filters (C-ILAF) may be provided. By way of contrast, C-ILAF, has a much wider range of control. FIG. 21 shows a C-ILAF with two AC switches, a small filter inductor to filter out the high switching frequency content, and the main capacitor. The switches may be operated with duty cycle D and (1-D), as in the case of the L-ILAF. For the C-ILAF circuit, duty cycle modulation is once again used at DC and even harmonic frequencies. Again, assuming only DC modulation with a duty cycle D, the reactive current drawn from the line is $D^2 * V_{rms}/X_c$, where Xc is the impedance of the capacitor at the line frequency. If modulation at the $2^{nd}$ harmonic frequency is considered, the $3^{rd}$ harmonic voltage impressed across the capacitor may be:

$$V_{C3} = \frac{-K_2 V_m}{2 X_C} \cos(3\omega t + \varphi_2)$$

This causes a 3rd harmonic current in the capacitor that is $$I_{C3} = \frac{2 K_0 K_2}{X_C} V_m \sin(3\omega t + \varphi_2) + \frac{K_2^2}{4 X_C} V_m \cos(3\omega t + 2\varphi_2)$$

The $5^{th}$ harmonic current that flows in the capacitor, as a result of a $4^{th}$ harmonic modulation component can be similarly calculated. While the harmonic voltage components generated may be determined by K2 and K4, the current increases with frequency as the impedance of the capacitor decreases. The effective current drawn from the line, is once again calculated by considering the action of the switching function on the capacitor current. The fundamental component current in and the $5^{th}$ harmonic current in $I_C$, both result in a $3^{rd}$ harmonic current being drawn from the AC line. The magnitude of this $3^{rd}$ harmonic current can thus be shown to be:

$$|I_{C3}| = \sqrt{4 K_0^2 K_2^2 + \frac{K_2^4}{16}}$$

When compared to the L-ILAF circuit, the maximum $3^{rd}$ harmonic current that can be sourced to the line is approximately 51% of the maximum fundamental frequency capacitive current possible, three times as much as for the L-ILAF. Further, considering that most applications require leading VARs and harmonic control, suggests that this may be a very attractive cost-effective implementation. Significant issues remain and need to be considered, the most important being the susceptibility to voltage spikes and transients.

Figure 22A:
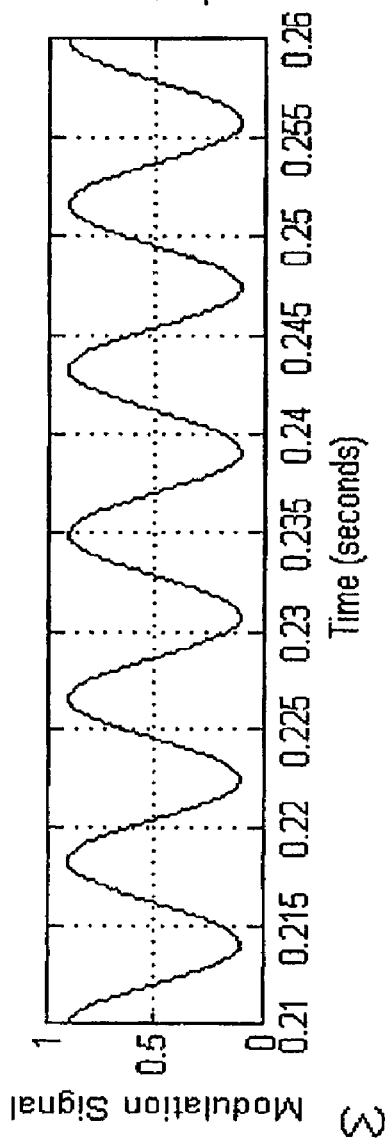
FIG. 22A through 22F show simulations results for a C-ILAF circuit operating with a single phase non-linear load.
Figure 22B:
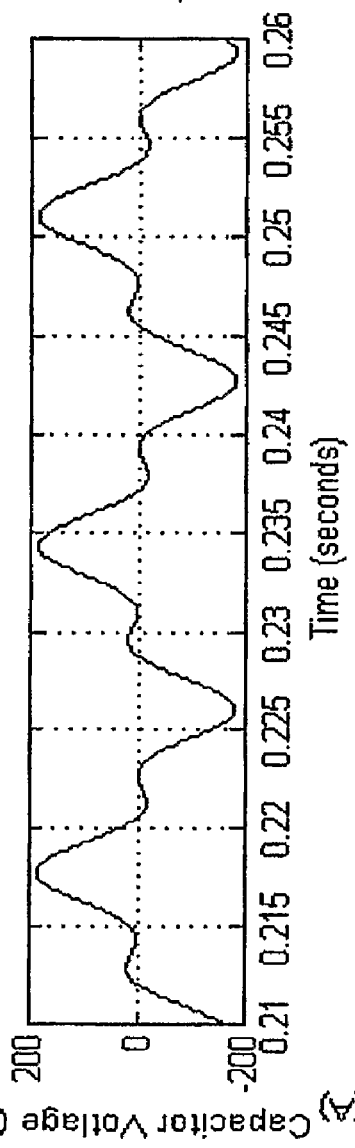
Figure 22C:
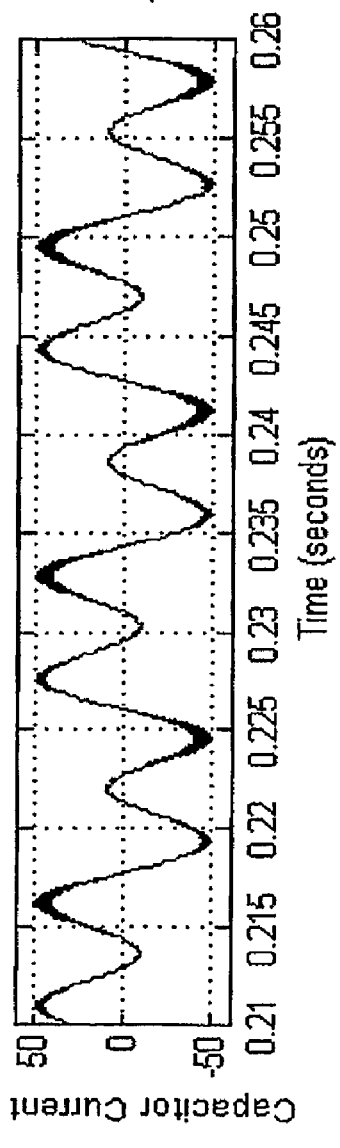
Figure 22D:
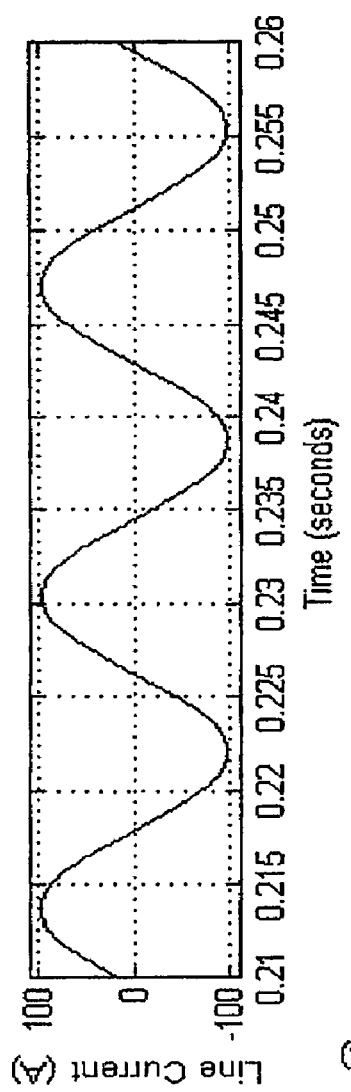
Figure 22E:
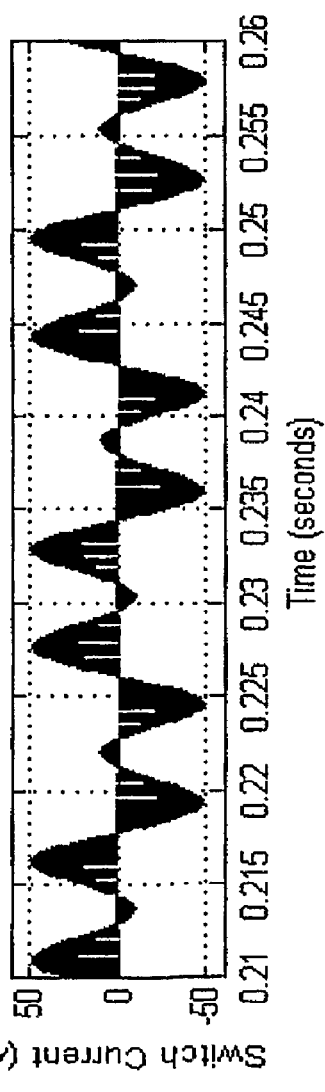
Figure 22F:
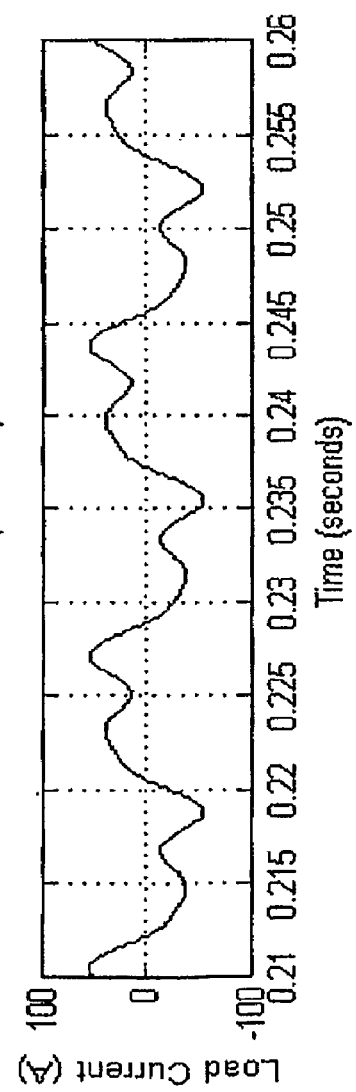
Figure 23A:
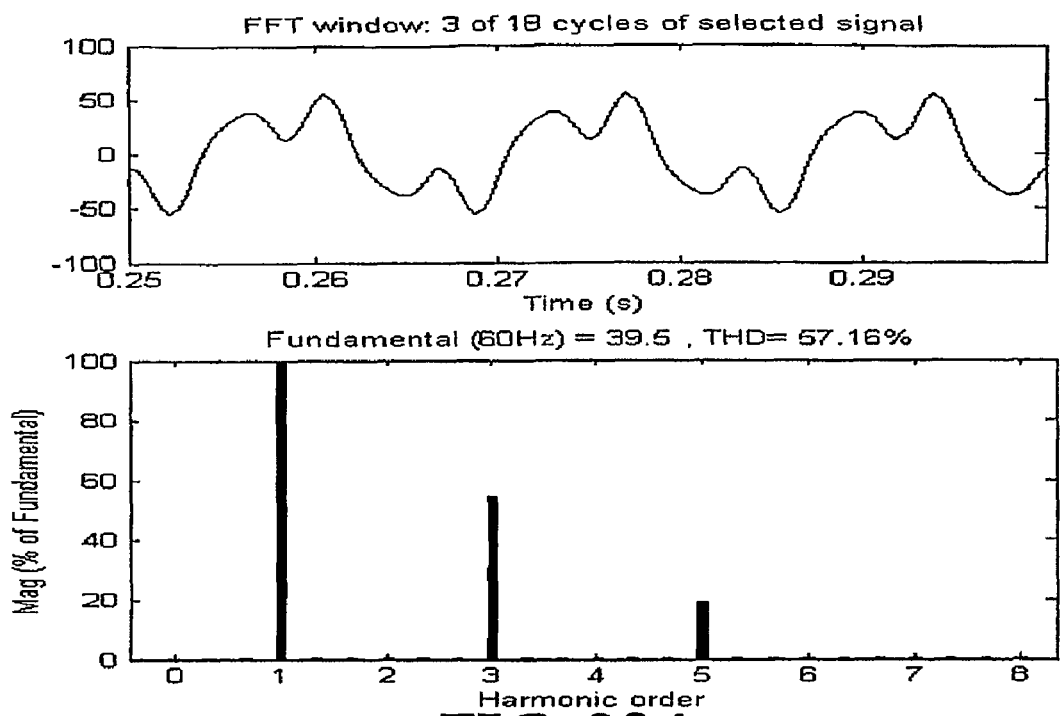
FIG. 23A shows FFT load current with THD=57.6%.
Figure 23B:
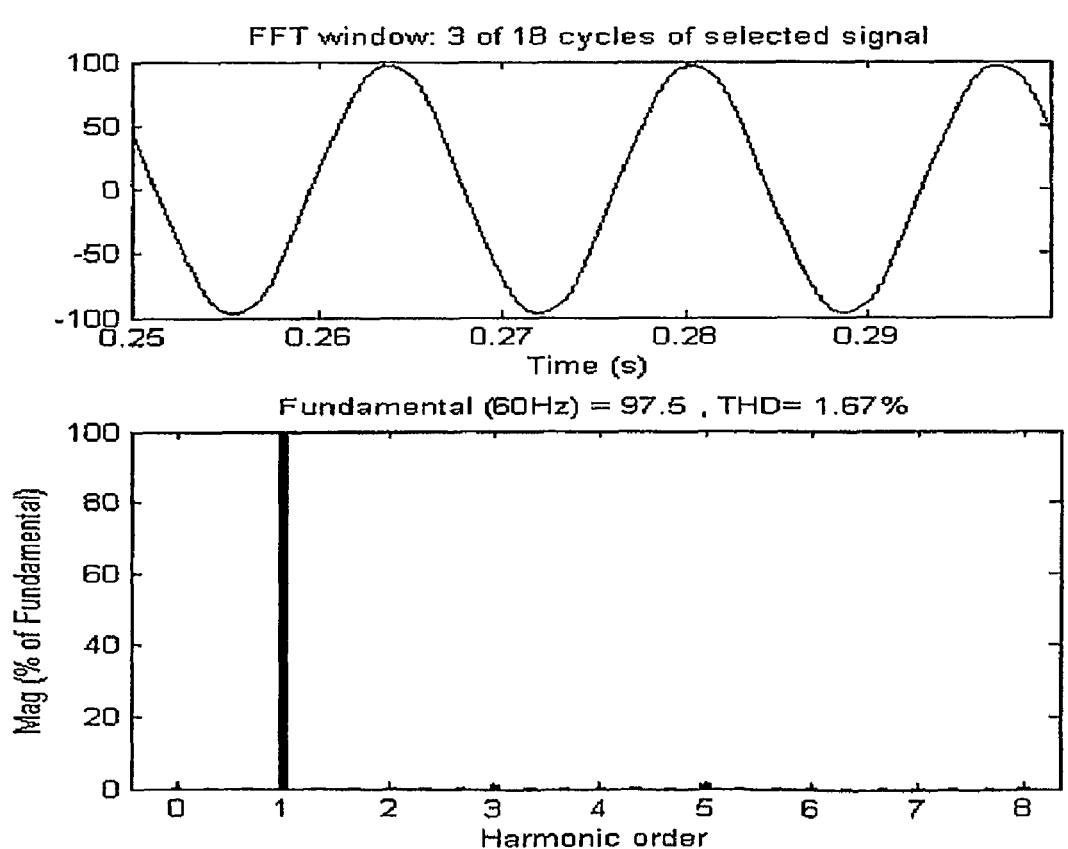
FIG. 23B shows line current with THD=1.67%.
Figure 24:
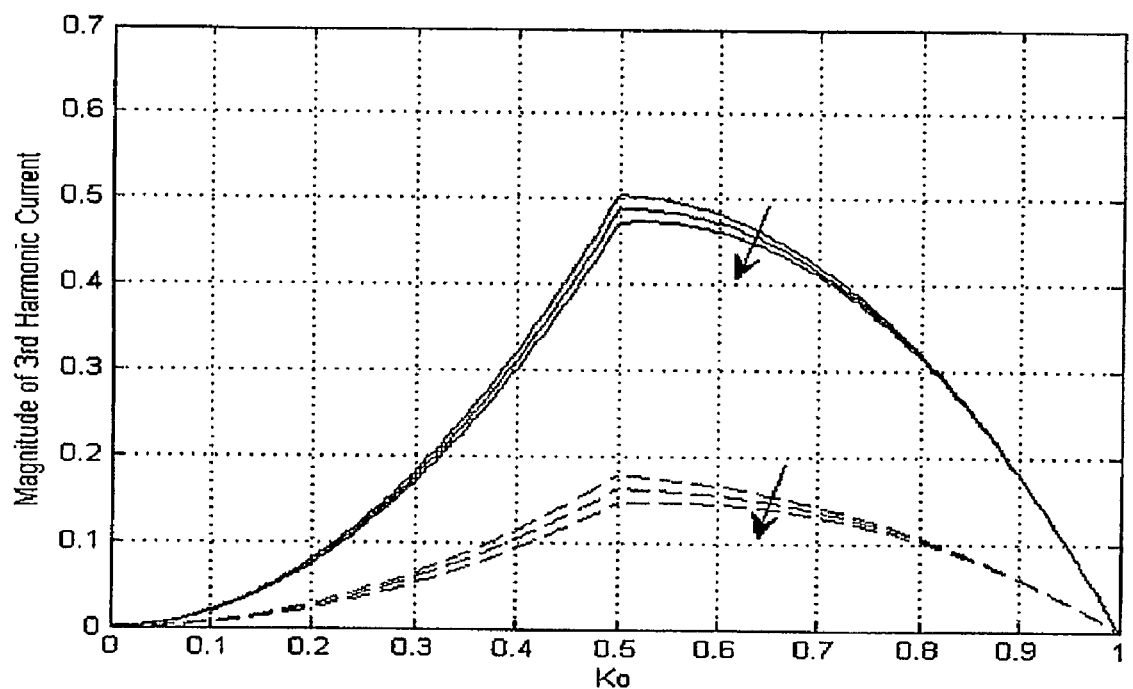
FIG. 24 shows the control range for fundamental VARs versus for harmonic compensation for the C-ILAF and I-LAF.

FIG. 22A through 22F show simulations results for a C-ILAF circuit operating with a single phase non-linear load. FIG. 22A shows a modulation signal, FIG. 22B shows capacitor voltage, FIG. 22C shows capacitor current, FIG. 22D shows line current, FIG. 22E shows switch current, and FIG. 22F shows load current. The harmonic levels can be reduced from a THD of 57.6% to as low as 1.67%. There are sufficient control handles to yield control of the fundamental frequency VARs, as well as multiple harmonic frequencies. FIG. 23A shows FFT load current with THD=57.6% and FIG. 23B shows line current with THD=1.67%. FIG. 24 shows the control range for fundamental VARs versus for harmonic compensation for the C-ILAF and I-LAF, assuming a single harmonic is to be compensated.

Generally, consistent with embodiments of the invention, program modules may include routines, programs, components, data structures, and other types of structures that may perform particular tasks or that may implement particular abstract data types. Moreover, embodiments of the invention may be practiced with other computer system configurations, including hand-held devices, multiprocessor systems, microprocessor-based or programmable consumer electronics, minicomputers, mainframe computers, and the like. Embodiments of the invention may also be practiced in distributed computing environments where tasks are performed by remote processing devices that are linked through a communications network. In a distributed computing environment, program modules may be located in both local and remote memory storage devices.

Furthermore, embodiments of the invention may be practiced in an electrical circuit comprising discrete electronic elements, packaged or integrated electronic chips containing logic gates, a circuit utilizing a microprocessor, or on a single chip containing electronic elements or microprocessors. Embodiments of the invention may also be practiced using other technologies capable of performing logical operations such as, for example, AND, OR, and NOT, including but not limited to mechanical, optical, fluidic, and quantum technologies. In addition, embodiments of the invention may be practiced within a general purpose computer or in any other circuits or systems.

Embodiments of the invention, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present invention may be embodied in hardware and/or in software (including firmware, resident software, micro-code, etc.). In other words, embodiments of the present invention may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present invention, for example, are described above with reference to block diagrams and/or operational illustrations of methods, systems, and computer program products according to embodiments of the invention. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the invention have been described, other embodiments may exist. Furthermore, although embodiments of the present invention have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Further, the disclosed methods' stages may be modified in any manner, including by reordering stages and/or inserting or deleting stages, without departing from the invention.

All rights including copyrights in the code included herein are vested in and the property of the Applicant. The Applicant retains and reserves all rights in the code included herein, and grants permission to reproduce the material only in connection with reproduction of the granted patent and for no other purpose.

While the specification includes examples, the invention's scope is indicated by the following claims. Furthermore, while the specification has been described in language specific to structural features and/or methodological acts, the claims are not limited to the features or acts described above. Rather, the specific features and acts described above are disclosed as example for embodiments of the invention.

What is claimed is:

1. A method for providing an AC output voltage, the method comprising:
   creating a quadrature wave form;
   creating a harmonic wave form;
   adding the quadrature wave form and the harmonic wave form to create a resultant wave form; and
   applying duty cycle control to the resultant wave form to create the output voltage with at least one of the following: controllable phase levels and controllable harmonic levels, without requiring the use of stored energy, without requiring the use of sources in addition to the quadrature wave form and the harmonic wave form, and without requiring the use of switches in addition to a two-switch pair.

2. The method of claim 1, wherein creating the quadrature wave form comprises creating the quadrature wave form having the same frequency as an input voltage.

3. The method of claim 1, wherein creating the quadrature wave form comprises creating the quadrature wave form being ninety degrees out of phase with an input voltage.

4. The method of claim 1, wherein creating the harmonic wave form comprises creating the harmonic wave form based upon an even harmonic of an input voltage.

5. The method of claim 1, wherein creating the harmonic wave form comprises creating the harmonic wave form comprising a triplen wave form.

6. The method of claim 1, wherein adding the quadrature wave form and the harmonic wave form to create the resultant wave form comprises adding the quadrature wave form and the harmonic wave form to create the resultant wave form that is contained within an envelope defined by an input voltage.

7. A system for providing an output voltage, the system comprising:
   a component configured to receive an input voltage;
   a component configured to create a quadrature wave form;
   a component configured to create a harmonic wave form;
   a component configured to add the quadrature wave form and the harmonic wave form to create a resultant wave form that is contained within an envelope defined by the input voltage; and
   a component configured to apply duty cycle control to the resultant wave form to create the output voltage with at least one of the following: controllable phase levels and controllable harmonic levels, without requiring the use of stored energy, without requiring the use of sources in addition to the quadrature wave form and the harmonic wave form, and without requiring the use of switches in addition to a two-switch pair.

8. The system of claim 7, wherein the component configured to create the quadrature wave form comprises the component configured to create the quadrature wave form having the same frequency as the input voltage.

9. The system of claim 7, wherein the component configured to create the quadrature wave form comprises the component configured to create the quadrature wave form being ninety degrees out of phase with the input voltage.

10. The system of claim 7, wherein the component configured to create the harmonic wave form comprises the component configured to create the harmonic wave form based upon an even harmonic of the input voltage.

11. The system of claim 7, wherein the component configured to create the harmonic wave form comprises the component configured to create the harmonic wave form comprising a triplen wave form.

12. A system for providing an output voltage, the system comprising:
   a memory storage; and
   a processing unit coupled to the memory storage, wherein the processing unit is operative to:
      create a quadrature wave form having substantially a 0.5 pu amplitude;
      create a harmonic wave form having substantially a 0.5 pu amplitude;
      add the quadrature wave form and the harmonic wave form to create a resultant wave form; and
      apply duty cycle control to the resultant wave form to create the output voltage with at least one of the following: controllable phase levels and controllable harmonic levels, without requiring the use of stored energy, without requiring the use of sources in addition to the quadrature wave form and the harmonic wave form, and without requiring the use of switches in addition to a two-switch pair.

13. The system of claim 12, wherein the processing unit being operative to create the quadrature wave form comprises the processing unit being operative to create the quadrature wave form having the same frequency as an input voltage.

14. The system of claim 12, wherein the processing unit being operative to create the quadrature wave form comprises the processing unit being operative to create the quadrature wave form being ninety degrees out of phase with an input voltage.

15. The system of claim 12, wherein the processing unit being operative to create the harmonic wave form comprises the processing unit being operative to create the harmonic wave form based upon an even harmonic of an input voltage.

16. The system of claim 12, wherein the processing unit being operative to create the harmonic wave form comprises the processing unit being operative to create the harmonic wave form comprising a triplen wave form.

17. The system of claim 12, wherein the processing unit being operative to add the quadrature wave form and the harmonic wave form to create the resultant wave form comprises the processing unit being operative to add the quadrature wave form and the harmonic wave form to create the resultant wave form that is contained within an envelope defined by an input voltage.

18. A method for providing an alternating current output voltage using even harmonic modulation, the method comprising:
   creating a direct current component having a first amplitude;
   creating an alternating current component comprising a second harmonic with a second amplitude and a phase angle;
   adding the direct current component and the alternating current component to create a resultant wave form; and
   applying duty cycle control to the resultant wave form to create the alternating current output voltage with at least one of the following: controllable phase levels and controllable harmonic levels, without requiring the use of stored energy, without requiring the use of sources in addition to the quadrature wave form and the harmonic wave form, and without requiring the use of switches in addition to a two-switch pair.

19. The method of claim 5, wherein creating the harmonic wave form comprises creating the harmonic wave form comprising a third-harmonic wave form.

20. The system of claim 11, wherein the component configured to create the harmonic wave form comprises the component configured to create the harmonic wave form comprising a third-harmonic wave form.

21. The system of claim 16, wherein the processing unit being operative to create the harmonic wave form comprises the processing unit being operative to create the harmonic wave form comprising a third-harmonic wave form.

* * * * *